(12) United States Patent
Kim et al.

(10) Patent No.: US 8,344,385 B2
(45) Date of Patent: Jan. 1, 2013

(54) VERTICAL-TYPE SEMICONDUCTOR DEVICE

(75) Inventors: Young-Hoo Kim, Seongnam-si (KR); Hyo-San Lee, Suwon-si (KR); Sang-Won Bae, Incheon (KR); Bo-Un Yoon, Seoul (KR); Kun-Tack Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 12/872,270

(22) Filed: Aug. 31, 2010

(65) Prior Publication Data
US 2011/0073866 A1    Mar. 31, 2011

(30) Foreign Application Priority Data
Sep. 29, 2009   (KR) .................. 10-2009-0092258

(51) Int. Cl.
*H01L 29/06* (2006.01)
*H01L 29/792* (2006.01)
(52) U.S. Cl. ............... 257/67; 257/74; 257/326
(58) Field of Classification Search .................. None
See application file for complete search history.

(56) References Cited

U.S. PATENT DOCUMENTS

| | | | | |
|---|---|---|---|---|
| 8,120,089 B2* | 2/2012 | Kim et al. | | 257/314 |
| 8,148,216 B2* | 4/2012 | Arai et al. | | 438/152 |
| 2007/0158736 A1* | 7/2007 | Arai et al. | | 257/315 |
| 2008/0173928 A1* | 7/2008 | Arai et al. | | 257/316 |
| 2009/0230459 A1* | 9/2009 | Kito et al. | | 257/324 |
| 2011/0298013 A1* | 12/2011 | Hwang et al. | | 257/208 |

(Continued)

FOREIGN PATENT DOCUMENTS
JP        06-338602      12/1994
(Continued)

OTHER PUBLICATIONS

Jaehoon Jang; et. al., "Vertical cell array using TCAT (Terabit Cell Array Transistor) technology for ultra high density NAND flash memory," VLSI Technology, 2009 Symposium on VSLI Technology Digest of Technical Papers, pp. 192-193, Jun. 16-18, 2009.*

(Continued)

*Primary Examiner* — Thomas L Dickey
*Assistant Examiner* — Joseph Schoenholtz
(74) *Attorney, Agent, or Firm* — Myers Bigel Sibley & Sajovec, P.A.

(57) ABSTRACT

In a vertical-type non-volatile memory device, an insulation layer pattern is provided on a substrate, the insulation layer pattern having a linear shape. Single-crystalline semiconductor patterns are provided on the substrate to make contact with both sidewalls of the insulation layer pattern, the single-crystalline semiconductor patterns having a pillar shape that extends in a vertical direction relative to the substrate. A tunnel oxide layer is provided on the single-crystalline semiconductor pattern. A lower electrode layer pattern is provided on the tunnel oxide layer and on the substrate. A plurality of insulation interlayer patterns is provided on the lower electrode layer pattern, the insulation interlayer patterns being spaced apart from one another by a predetermined distance along the single-crystalline semiconductor pattern. A charge-trapping layer and a blocking dielectric layer are sequentially formed on the tunnel oxide layer between the insulation interlayer patterns. A plurality of control gate patterns is provided on the blocking dielectric layer between the insulation interlayer patterns. An upper electrode layer pattern is provided on the tunnel oxide layer and on the uppermost insulation interlayer pattern.

20 Claims, 21 Drawing Sheets

U.S. PATENT DOCUMENTS

| | | | |
|---|---|---|---|
| 2011/0298037 A1* | 12/2011 | Choe et al. | 257/324 |
| 2011/0298038 A1* | 12/2011 | Son et al. | 257/324 |
| 2011/0303970 A1* | 12/2011 | Kim et al. | 257/324 |
| 2011/0306195 A1* | 12/2011 | Kim et al. | 438/591 |
| 2012/0028450 A1* | 2/2012 | Son et al. | 438/479 |
| 2012/0032250 A1* | 2/2012 | Son et al. | 257/324 |
| 2012/0049268 A1* | 3/2012 | Chang et al. | 257/324 |
| 2012/0068255 A1* | 3/2012 | Lee et al. | 257/324 |
| 2012/0086072 A1* | 4/2012 | Yun et al. | 257/329 |
| 2012/0094453 A1* | 4/2012 | Han et al. | 438/269 |

FOREIGN PATENT DOCUMENTS

| | | | |
|---|---|---|---|
| JP | 06338602 A | * | 12/1994 |
| JP | 2007-180389 | | 7/2007 |
| JP | 2007180389 A | * | 7/2007 |
| JP | 2007-317874 | | 12/2007 |
| JP | 2007317874 A | * | 12/2007 |

OTHER PUBLICATIONS

Erh-Kun Lai; et. al., "A Multi-Layer Stackable Thin-Film Transistor (TFT) NAND-Type Flash Memory," Electron Devices Meeting, 2006. IEDM '06. International, pp. 1-4, Dec. 11-13, 2006.*

Wonjoo Kim; Sangmoo Choi; Junghun Sung; Taehee Lee; Chulmin Park; Hyoungsoo Ko; Juhwan Jung; Inkyong Yoo; Yoondong Park; , "Multi-layered Vertical Gate NAND Flash overcoming stacking limit for terabit density storage," VLSI Technology, 2009 Symposium on VLSI Technology Digest of Technical Papers pp. 188-189, Jun. 16-18, 2009.*

B.Jiyoung Kim; et. al.,"Novel Vertical-Stacked-Array-Transistor (VSAT) for ultra-high-density and cost-effective NAND Flash memory devices and SSD (Solid State Drive)," VLSI Technology, 2009 Symposium on VLSI Technology Digest of Technical Papers pp. 186-187, Jun. 16-18, 2009.*

Yaegashi, T et. al., "20nm-node planer MONOS cell technology for multi-level NAND Flash Memory," VLSI Technology, 2009 Symposium on VLSI Technology Digest of Technical Papers, pp. 190-191, Jun. 16-18, 2009.*

Yi-Hsuan Hsiao; Hang-Ting Lue; Tzu-Hsuan Hsu; Kuang-Yeu Hsieh; Chih-Yuan Lu; , "A critical examination of 3D stackable NAND Flash memory architectures by simulation study of the scaling capability," Memory Workshop (IMW), 2010 IEEE International, vol., no., pp. 1-4, May 16-19, 2010.*

Chang-Hyun Lee et. al., "Multi-Level NAND Flash Memory with 63 nm-Node TANOS (Si-Oxide-SiN-Al2O3-TaN) Cell Structure," VLSI Technology, 2006. Digest of Technical Papers. 2006 Symposium on VLSI Technology Digest of Technical Papers , pp. 21-22.*

Eun-Seok Choi; Hyun-Seung Yoo; Han-Soo Joo; Gyu-Seog Cho; Sung-Kye Park; Seok-Kiu Lee; , "A Novel 3D Cell Array Architecture for Terra-Bit NAND Flash Memory," Memory Workshop (IMW), 2011 3rd IEEE International , pp. 1-4, May 22-25, 2011.*

Jang-Gn Yun, Jong Duk Lee, Byung-Gook Park, 3D NAND flash memory with laterally-recessed channel (LRC) and connection gate architecture, Solid-State Electronics, vol. 55, Issue 1, Jan. 2011, pp. 37-43.*

* cited by examiner

VERTICAL-TYPE SEMICONDUCTOR DEVICE

PRIORITY STATEMENT

This application claims priority under 35 U.S.C. §119 to Korean Patent Application No. 10-2009-0092258, filed on Sep. 29, 2009 in the Korean Intellectual Property Office (KIPO), the contents of which are herein incorporated by reference in their entirety.

BACKGROUND

1. Field

Example embodiments relate to a vertical-type semiconductor device and a method of manufacturing the same. More particularly, example embodiments relate to a vertical-type non-volatile memory device including cell transistors that are connected vertically to one another and a method of manufacturing the same.

2. Description of the Related Art

Recently, in order to improve the degrees of integration of memory devices, a method of forming cell transistors included in each unit block in a vertical direction relative to the substrate has been researched. In particular, in the NAND-type flash memory device, the cell transistors can be stacked in a vertical direction to form a cell string, to thereby improve the degree of integration of a memory device.

When the cell transistors included in the flash memory device are formed to be stacked vertically, each of the cell transistors may include a charge-trapping layer.

SUMMARY

In some embodiments according to the inventive concept, a vertical-type non-volatile memory device can include an insulation layer pattern on a substrate, where the insulation layer pattern has a linear shape. Single-crystalline semiconductor patterns are on the substrate directly on a sidewall of the insulation layer pattern, where the single-crystalline semiconductor patterns have a pillar shape that extends in a vertical direction oriented perpendicular relative to a major surface of the substrate. A tunnel oxide layer is on the single-crystalline semiconductor pattern and a lower electrode layer pattern is on the tunnel oxide layer and on the substrate. A plurality of insulation interlayer patterns are on the lower electrode layer pattern, where the insulation interlayer patterns are spaced apart from one another by a distance along the single-crystalline semiconductor pattern. A charge-trapping layer and a blocking dielectric layer are on the tunnel oxide layer between the insulation interlayer patterns. A plurality of control gate patterns are on the blocking dielectric layer between the insulation interlayer patterns and an upper electrode layer pattern is on the tunnel oxide layer and on an uppermost portion of the insulation interlayer pattern.

According to some example embodiments, in a method of manufacturing a vertical-type non-volatile memory device, an impurity region is formed in a semiconductor substrate. An insulation layer is formed on the impurity region. A lower electrode layer is formed on the insulation layer. Insulation interlayers and sacrificial layers are formed repeatedly on the lower electrode layer. An upper electrode layer is formed on the uppermost insulation interlayer. A channel hole is formed in the repeatedly stacked layers to form insulation interlayer patterns and sacrificial layer patterns, the impurity region being exposed through the channel hole. Tunnel oxide layers are formed on both sidewalls of the channel hole, respectively. A single-crystalline semiconductor pattern is formed on the tunnel oxide layer. An insulation layer pattern is formed to fill up the channel hole. The sacrificial layer patterns are removed to expose the tunnel oxide layer. A charge-trapping layer and a blocking dielectric layer are formed on the tunnel oxide layer. Control gate patterns are formed on the blocking dielectric layer between the insulation interlayer patterns.

According to some example embodiments, a vertical-type non-volatile memory device includes a cell string of a ground source transistor, a string select transistor and cell transistors formed on a pillar shaped single-crystalline semiconductor pattern, wherein the ground source transistor and the string select transistor have no charge-trapping layer between upper and lower electrode layer patterns and a tunnel oxide layer. Therefore, the voltage drop occurring during operation of the ground source transistor and the string select transistor may be reduced to thereby increase reliability of the memory device. In addition, the number of the single-crystalline semiconductor patterns to be formed in a volume with a narrow lateral dimension may be increased, and thus the degree of integration of the memory device may be enhanced. Further, since the cell transistors may be formed in the single-crystalline semiconductor pattern with fewer crystal defects, a cell current and cell distribution characteristics of the cell transistor may be improved.

Therefore, since there is no charge-trapping layer on the gate of the ground source transistor or the string select transistor, the voltage drop may be reduced to decrease the operation voltage thereof.

DETAILED DESCRIPTION OF EMBODIMENTS ACCORDING TO THE INVENTIVE CONCEPT

Figure 1:
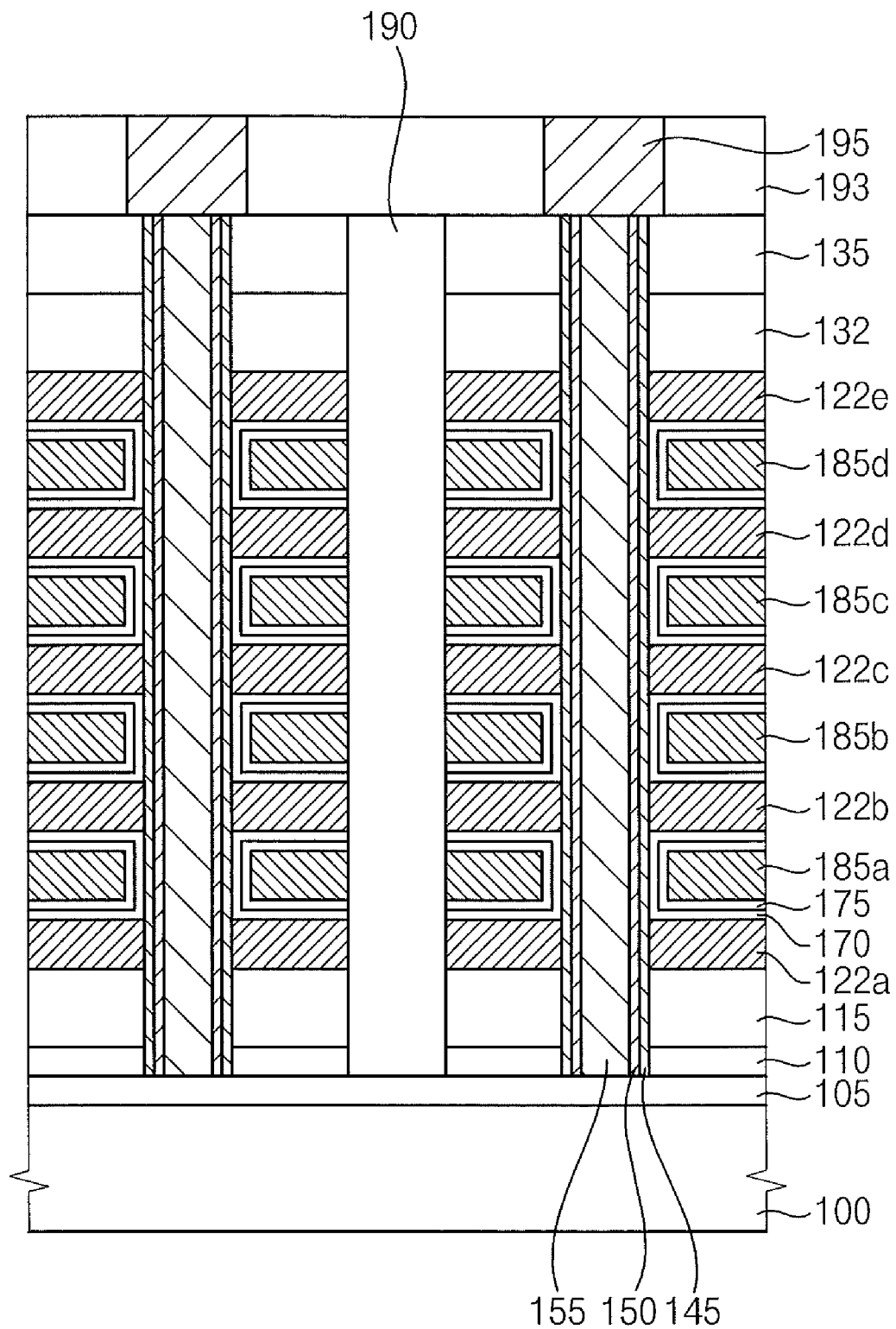
FIG. 1 is a cross-sectional view illustrating a cell transistor region of a non-volatile memory device in accordance with an example embodiment.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating a cell transistor region of a non-volatile memory device in accordance with an example embodiment.

Referring to FIG. 1, a substrate 100 including a single-crystalline semiconductor material is provided. For example, the substrate 100 may include single-crystalline silicon.

An impurity region 105 is provided in a surface of the substrate 100 to be provided as a common source line. An insulation layer 110 is formed on the impurity region 105.

Single-crystalline semiconductor patterns 150 of pillar shapes are provided in a vertical direction on the semiconductor substrate 100. The single-crystalline semiconductor pattern 150 makes contact with the impurity region 105. The single-crystalline semiconductor patterns 150 may be arranged regularly on the substrate 100. For example, the single-crystalline semiconductor patterns 150 may be arranged repeatedly to be spaced apart from one another by a predetermined distance.

The single-crystalline semiconductor pattern 150 may include single-crystalline silicon. The single-crystalline silicon may be formed to undergo phase transition from amorphous silicon by a thermal treatment. Alternatively, the single-crystalline silicon may be formed by a selective epitaxial growth (SEG) process using the substrate 100 as a seed.

Cell transistors and select transistors are provided on the one single-crystalline semiconductor pattern 150 to constitute one cell string. The cell transistor includes a charge-trapping layer. The cell transistors are serially connected to one another in the vertical direction on the substrate 100. The cell transistors of a common cell string are connected to one another along the single-crystalline semiconductor pattern in the vertical direction.

An upper select transistor is provided to be connected to the uppermost cell transistor and a lower selection transistor is provided to be connected to the lowermost cell transistor. The lower select transistor includes a lower gate electrode 115 to be used as a ground source line (GSL). The upper selection transistor includes an upper gate electrode 132 to be used as a string select line (SSL). A tunnel oxide layer is formed directly on the upper and lower gate electrodes, respectively. Accordingly, the charge-trapping layer may not be formed on the upper and lower gate electrodes.

For example, the cell transistors numbering $2^n$ (where n is a natural number greater than 1) may be formed in one cell string on the substrate 100. In a non-volatile memory device of the present embodiment, as the number of the cell transistors included in the cell string is increased, the number of the cell transistors to be stacked in the vertical direction is increased so that it may be difficult to form the cell transistors. Accordingly, four or eight cell transistors may be connected in series to one another in one cell string. In this example embodiment, four cell transistors are shown as being connected in series to each other.

Insulation layer patterns 122a, 122b, 122c, 122d and 122e are provided in the vertical direction between cell gates of the cell transistors.

A bit line 195 is provided on the single-crystalline semiconductor patterns 150 to electrically connect the single-crystalline semiconductor pattern 150 arranged in a first direction.

Hereinafter, the cell transistors provided on the single-crystalline semiconductor pattern will be further explained in detail.

The GSL gate electrode 115 is provided on the insulation layer 110. The GSL gate electrode 115 is formed on the tunnel oxide layer 145. Accordingly, a charge-trapping layer may not be formed on the GSL gate electrode 115.

An insulation layer pattern 155 of a linear shape is provided on the impurity region 105 in the substrate 100. The pillar shaped single-crystalline semiconductor patterns 150 are provided on a sidewall of the insulation layer pattern 155. The single-crystalline semiconductor pattern 150 may extend in the vertical direction on the substrate 100. For example, the single-crystalline semiconductor pattern 150 may have a rectangular parallelepiped shape. Other shapes may be used.

The first to n+1th insulation interlayer patterns (n is a natural number greater than 1) are provided on each of the single-crystalline semiconductor patterns 150. The first to n+1th insulation interlayer patterns may be arranged to be spaced apart from one another along a sidewall of the single-crystalline semiconductor pattern 150. The number of the insulation interlayer patterns may be one more than the number of the cell transistors in one cell string. N may be a natural number, more preferably, n may be $2m$ (m is a natural number greater than 1). In this embodiment, first to 5th insulation interlayer patterns 122a, 122b, 122c, 122d and 122e may be provided on the single-crystalline semiconductor pattern 150.

The first to nth control gate patterns (n is a natural number greater than 1) are provided between the insulation interlayer patterns. In this embodiment, the first to 4th control gate patterns 185a, 185b, 185c and 185d may be provided along the single-crystalline semiconductor pattern 150.

The tunnel oxide layer 145 is formed on the single-crystalline semiconductor pattern 150. A charge-trapping layer 170 and a blocking dielectric layer 175 are sequentially formed on the tunnel oxide layer 145. The charge-trapping layer 170 makes contact with a portion of the tunnel oxide layer 145. The contact portions of the charge-trapping layer 170 are spaced apart from one another in the vertical direction by a predetermined distance. The control gate patterns 185a, 185b, 185c and 185d are formed on the blocking dielectric layer 175 between the insulation interlayer patterns.

The charge-trapping layer 170 may include silicon nitride or metal oxide that is capable of trapping electric charge. The charge-trapping layer 124 may be formed using silicon nitride to be deposited to a relatively small thickness.

The blocking dielectric layer 175 is formed on the charge-trapping layer 170. The blocking dielectric layer 175 may be formed using silicon oxide or metal oxide. The metal oxide may be a material having a dielectric constant higher than silicon nitride. The charge-trapping layer 170 and the blocking dielectric layer 175 may be conformally formed to follow the profile of the insulation interlayer patterns.

The first to nth control gate patterns 185a, 185b, 185c and 185d are formed on the blocking dielectric layer 175 between the insulation interlayer patterns 122a, 122b, 122c, 122d and 122e.

The control gate pattern in each of the layers may have a linear shape extending in the first direction. Accordingly, the control gate patterns 185a, 185b, 185c and 185d in the same layer arranged in the first direction may have a linear shape, and thus, the control gate pattern may be provided as a word line. On the other hand, the control gate patterns 185a, 185b, 185c and 185d of different layers may be insulated from one another by the insulation interlayer patterns 122a, 122b, 122c, 122 and 122e.

The insulation interlayer pattern may include an insulation material having an etch selectivity with respect to the silicon oxide and the single-crystalline semiconductor pattern. For example, the insulation interlayer pattern may include silicon nitride.

The control gate patterns 185a, 185b, 185c and 185d are arranged in the vertical direction along the single-crystalline semiconductor pattern 150. The insulation interlayer patterns 122a, 122b, 122c, 122 and 122e and the control gate patterns 185a, 185b, 185c and 185d are alternatively stacked in the vertical direction.

An isolation insulation layer pattern 190 is formed between the insulation interlayer patterns 122a, 122b, 122c, 122 and 122e and the control gate patterns 185a, 185b, 185c and 185d stacked on another.

The bit line 195 is provided on an upper surface of the single-crystalline semiconductor patterns 150 to connect the single-crystalline semiconductor patterns 150 that are spaced apart from one another and arranged repeatedly in the first direction.

The tunnel oxide layer 145 and the GSL gate electrode 115 are provided on the sidewall of the lowermost portion of the single-crystalline semiconductor pattern 150. The tunnel oxide layer 145 and the SSL gate electrode 132 are provided on the sidewall of the uppermost portion of the single-crystalline semiconductor pattern 150. Accordingly, the upper select transistor (string select line) 132 is provided between the bit line 195 and the uppermost cell transistor 185d and the lower select transistor (ground source line) 115 is provided between the substrate 100 and the lowermost cell transistor 185a.

The impurity region 105 is provided in the surface of the substrate 100 to be connected to the single-crystalline semiconductor patterns 150. The impurity region 105 may be used as a common source line. The impurity region 105 may include N-type impurities. The impurity region 105 may be connected to the single-crystalline semiconductor patterns 150, such that lower portions of the strings are connected to one another.

As mentioned above, a vertical-type flash memory device in accordance with an example embodiment includes a cell string of a ground source transistor, a string select transistor and cell transistors formed on the pillar shaped single-crystalline semiconductor pattern, wherein the ground source transistor and the string select transistor have no charge-trapping layer between the upper and lower electrode layer patterns and the tunnel oxide layer. Therefore, the voltage drop occurring during operation of the ground source transistor and the string select transistor may be reduced to thereby increase reliability of the memory device. In addition, the number of the single-crystalline semiconductor patterns to be formed in a volume with a narrow lateral dimension may be increased, and thus the degree of integration of the memory device may be enhanced. Further, since the cell transistors may be formed in the single-crystalline semiconductor pattern with fewer crystal defects, a cell current and cell distribution characteristics of the cell transistor may be improved.

Since there is no charge-trapping layer in the GSL gate and the SSL gate, the voltage drop may be reduced to decrease the operation voltage thereof.

FIGS. 2 to 11 are cross-sectional views illustrating a method of manufacturing the cell transistor region of the vertical-type non-volatile memory device in FIG. 1.

Figure 2:
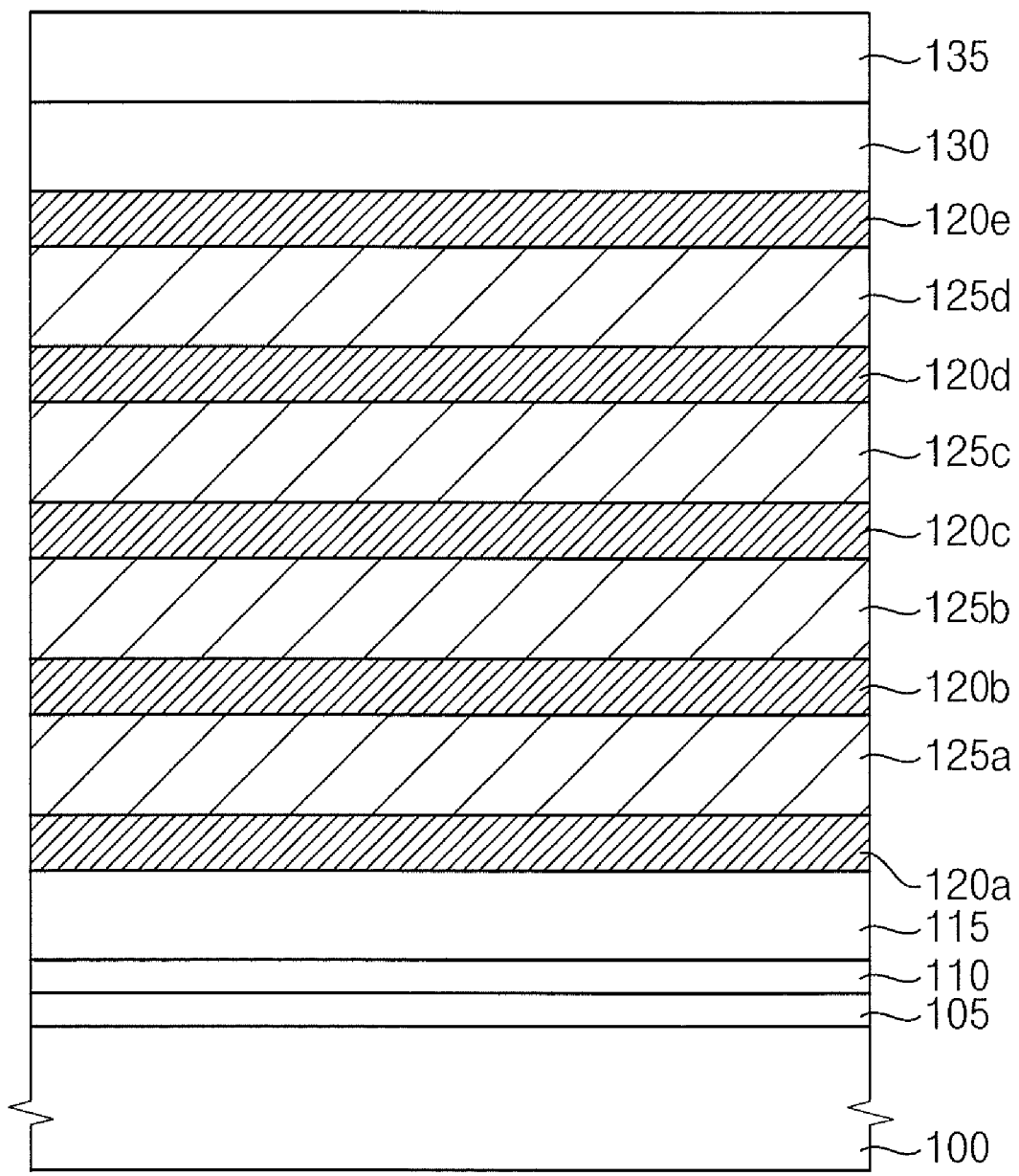
FIGS. 2 to 11 are cross-sectional views illustrating a method of manufacturing the cell transistor region of the vertical-type non-volatile memory device in FIG. 1.

Referring to FIG. 2, a substrate 100 including single-crystalline silicon is prepared. N-type impurities are partially doped into the substrate 100 to form an impurity region 105. The impurity region 105 may be provided as a source line of a NAND flash memory device. The N-type impurities are doped in a surface of the substrate 100 where one cell block is formed, to form the impurity region 105.

An insulation layer 110 is formed on the substrate 100 including the impurities therein. The insulation layer 110 may be formed by a thermal oxidation process or a chemical vapor deposition process. The insulation layer 110 may be formed to have a thickness of about 200 Angstroms to about 500 Angstroms.

A lower electrode layer 115 is formed on the insulation layer 110. The lower electrode layer 115 may be patterned to be used as a ground source line by following processes. For example, the lower electrode layer 115 may be formed using polysilicon doped with impurities or metal.

Insulation interlayers and sacrificial layers are repeatedly formed on the lower electrode layer 115.

An insulation interlayer 120a is formed on the lower electrode layer 115. The insulation interlayer 120a may be formed by a chemical vapor deposition process. For example, the insulation interlayer 120a may be formed using silicon oxide. The insulation interlayer 120a may be formed to have a thickness of about 500 Angstroms to about 1000 Angstroms.

A first sacrificial layer 125a is formed on the insulation interlayer 120a. For example, the first sacrificial layer 125a may be formed using a material having an etch selectivity with respect to the insulation interlayer 120a. For example, the first sacrificial layer 125a may include silicon nitride. The first sacrificial layer 125a may be formed to have about 500 Angstroms to about 1000 Angstroms. The thickness of the sacrificial layer may be greater than that of a control gate layer to be formed by a following process.

Another insulation interlayer 120b is formed on the first sacrificial layer 125a using the same process as the insulation interlayer 120a. Another first sacrificial layer 125b is formed on another insulation interlayer 120b using the same process as the first sacrificial layer 125a. Similarly, the first to n+1th insulation interlayer patterns (n is a natural number greater than 1) may be formed repeatedly on the lower electrode layer 115. In this embodiment, the first to 5th insulation interlayers 120a, 120b, 120c, 120d and 120e and the first sacrificial layers 125a, 125b, 125c and 125d may be alternately stacked with one another.

An upper electrode layer 130 is formed on the uppermost insulation interlayer 120e. The upper electrode layer 130 may be patterned to be used as a string select line by following processes. For example, the upper electrode layer 130 may be formed using polysilicon doped with impurities or metal.

An upper insulation layer 135 is formed on the upper electrode layer 130. The upper insulation layer may be formed using silicon oxide by a chemical vapor deposition process or a physical vapor deposition process.

Figure 3:
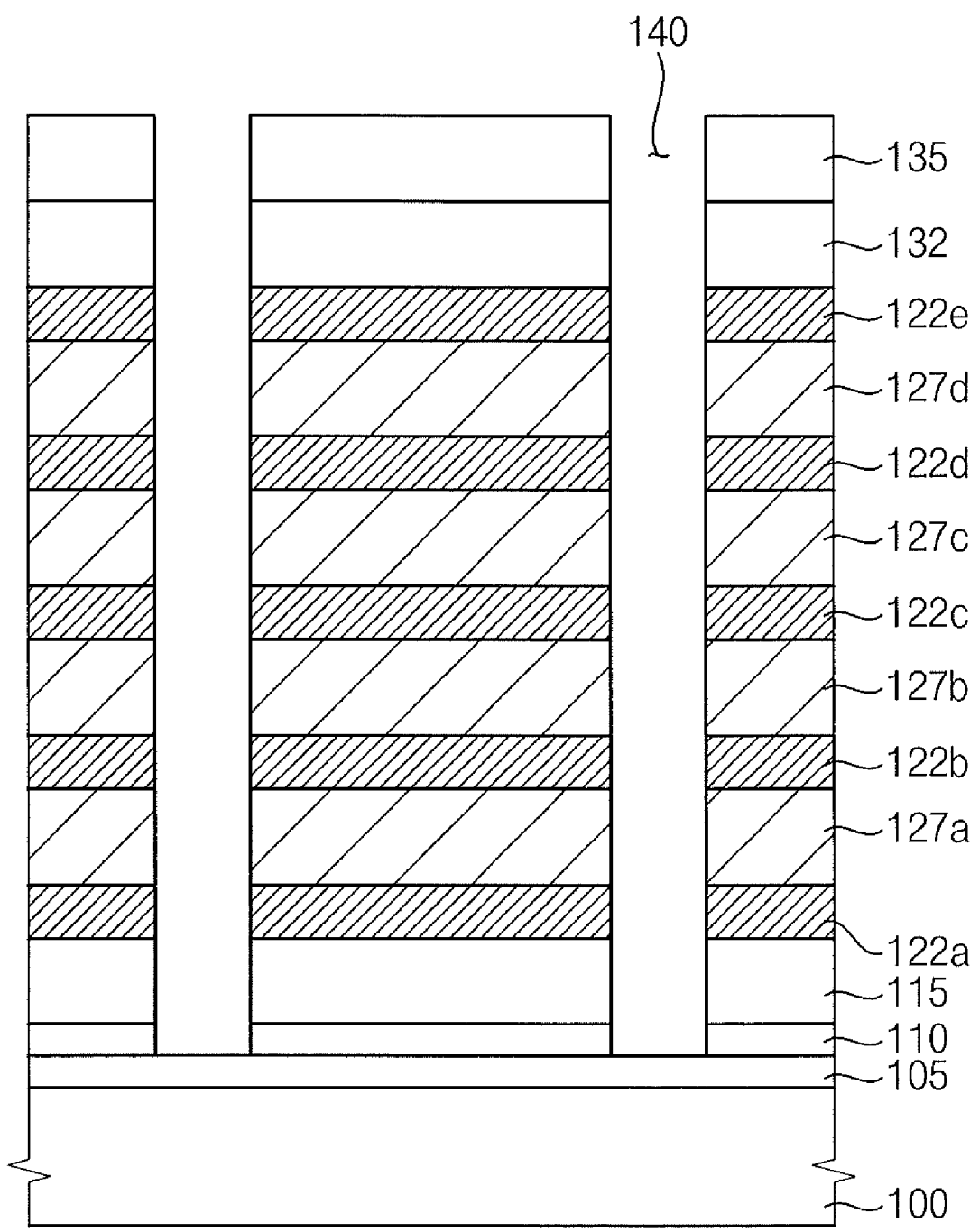

Referring to FIG. 3, a photolithography process is performed on the repeatedly stacked layers on the substrate to form a channel hole (i.e., recess) 140. The channel hole 140 may be formed to expose the impurity region 105. For example, a portion of the repeatedly stacked layers may be anisotropically etched until a surface of the substrate is exposed, to form the channel hole 140.

Figure 4:
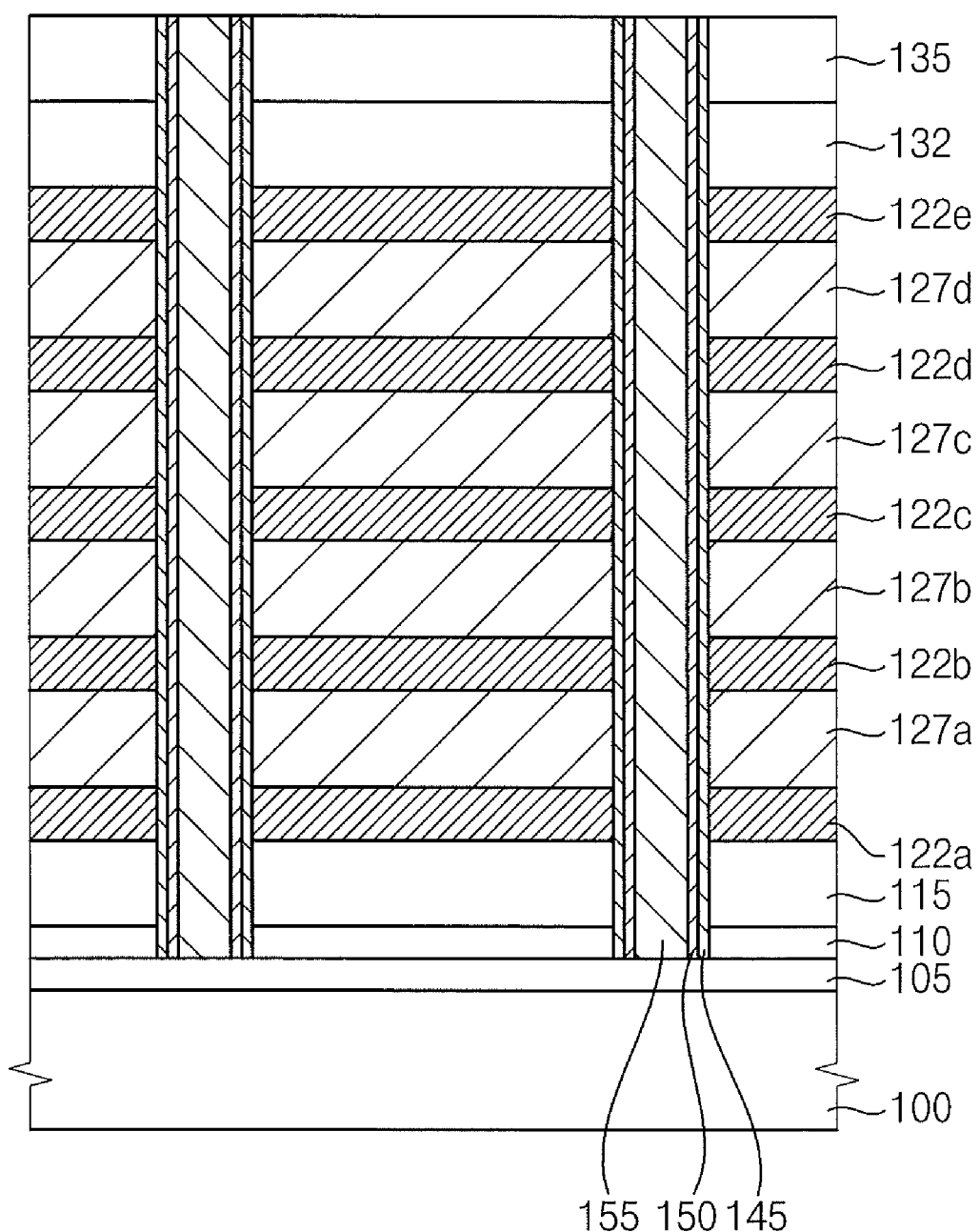

Referring to FIG. 4, a tunnel oxide layer 145 is formed on a sidewall of the channel hole 140. A single-crystalline semiconductor pattern 150 is formed on the tunnel oxide layer 145. The tunnel oxide layer 145 may be formed using silicon oxide. The tunnel oxide layer 145 may be formed to have a thickness of about 30☐-100☐. A polysilicon layer may be formed on the tunnel oxide layer 145 by a chemical vapor deposition process or an atomic layer deposition process, and then, the polysilicon layer may undergo phase transition from amorphous silicon by a laser thermal treatment, to form the single-crystalline semiconductor pattern 150.

After the tunnel oxide layer 145 and the single-crystalline semiconductor pattern 150 are formed on a sidewall of the channel hole 140, an oxide layer 155 is formed to fill a void between the single-crystalline semiconductor patterns 150 facing each other. Accordingly, the pillar shaped single-crystalline semiconductor patterns 150 are formed respectively on both sidewalls of the oxide layer 150, and the tunnel oxide layer 145 is formed on the single-crystalline semiconductor pattern 150.

Figure 5:
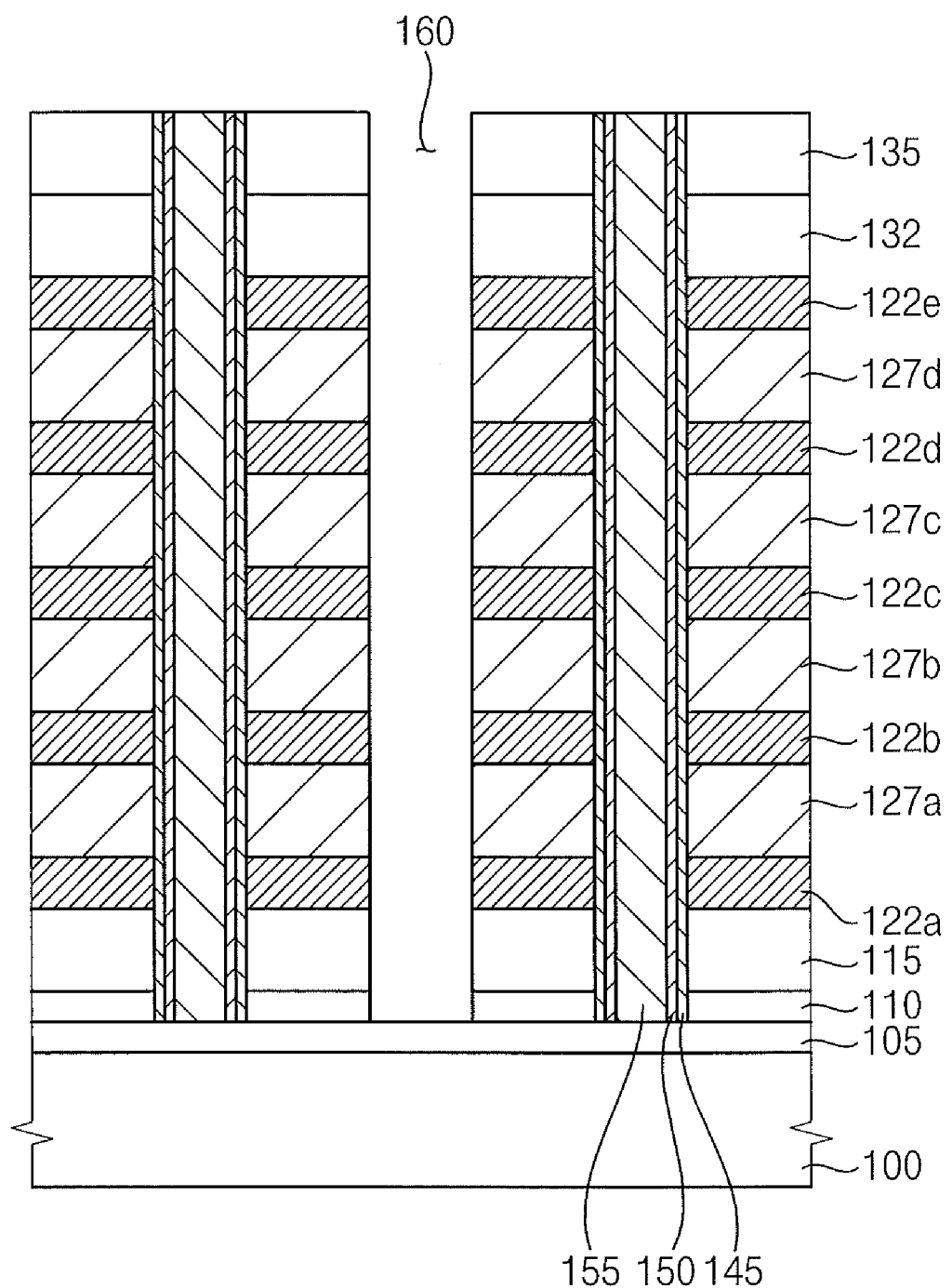

Referring to FIG. 5, a photolithography process is performed to form a hole 160 for removing first sacrificial layer patterns 127a, 127b, 127c and 127d in the middle of the first sacrificial layer patterns. The impurity region 105 may be exposed through the hole 160.

Figure 6:
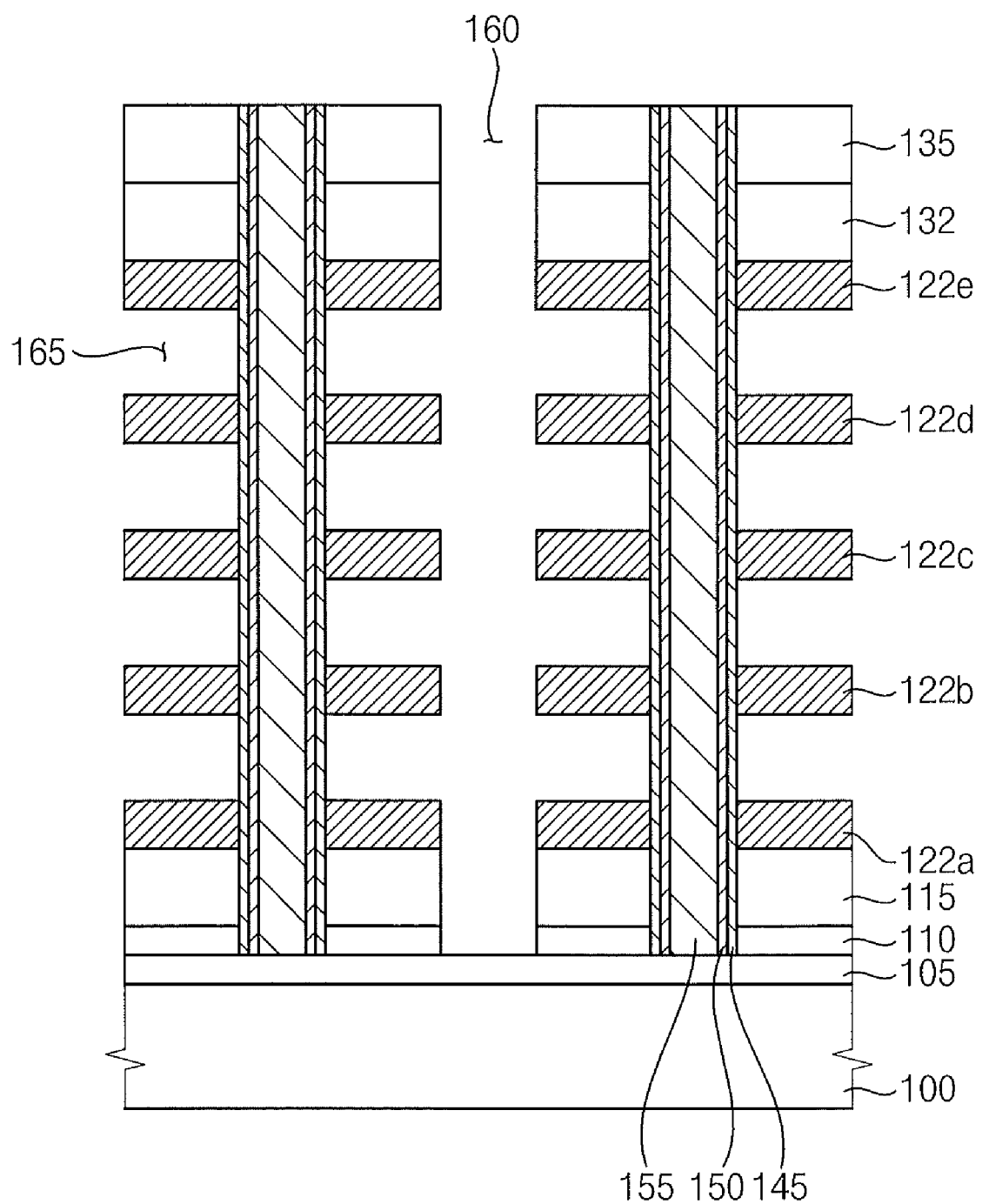

Referring to FIG. 6, an etch solution is applied through the hole 160 to remove the first sacrificial layer patterns 127a, 127b, 127c and 127d. Because the first sacrificial layer patterns include nitride, the first sacrificial layer patterns 127a, 127b, 127c and 127d may be removed using the etch solution including phosphoric acid.

Accordingly, the first sacrificial layer patterns 127a, 127b, 127c and 127d are removed to provide a space for forming a charge-trapping layer, a blocking dielectric layer and a control gate pattern.

Figure 7:
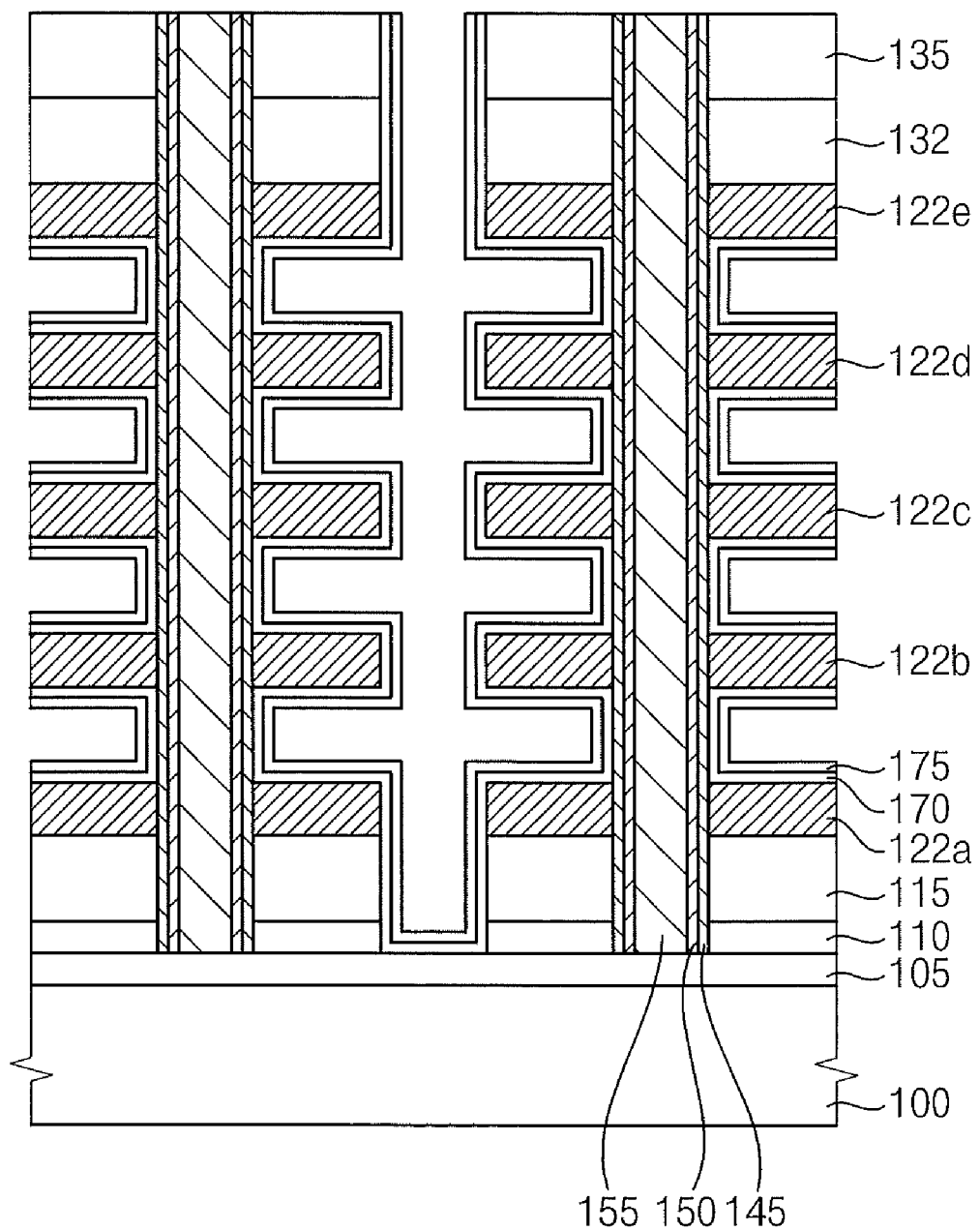

Referring to FIG. 7, a charge-trapping layer 170 is formed on first to 5th insulation interlayer patterns 122a, 122b, 122c, 122d and 122e. The charge-trapping layer 170 may be formed using an insulation material capable of trapping electric charge. For example, the charge-trapping layer 170 may be formed using silicon nitride or metal oxide. In this embodiment, silicon nitride may be deposited to form the charge-trapping layer having a relatively small thickness.

A blocking dielectric layer 175 is formed on the charge-trapping layer 170. The blocking dielectric layer 175 may be formed using silicon oxide or metal oxide. The metal oxide may be a material having a dielectric constant higher than silicon nitride. In here, the charge-trapping layer 170 and the blocking dielectric layer 175 may be conformally formed to follow the profile of the insulation interlayer patterns without completely filling the opening 165.

Figure 8:
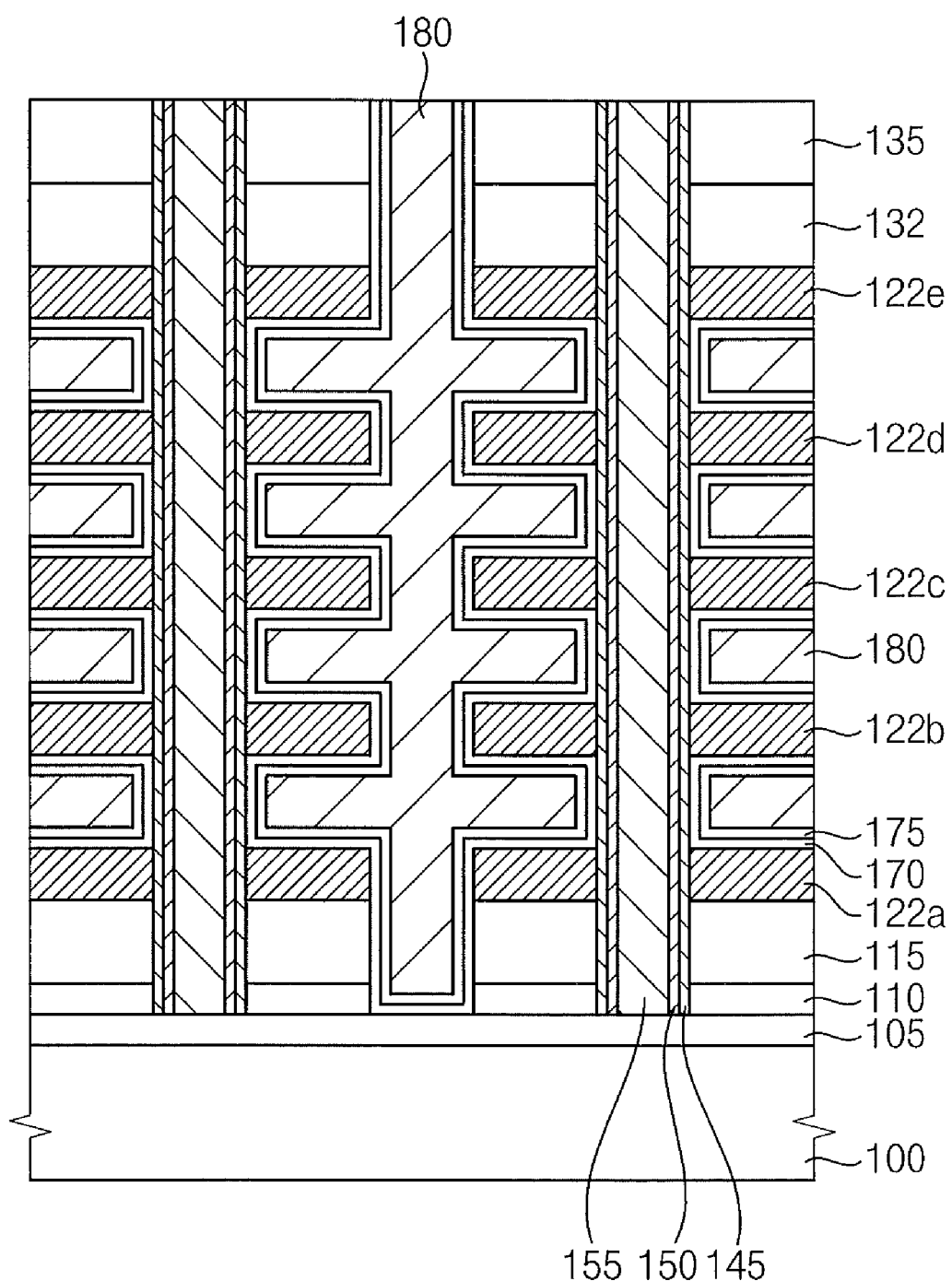
Figure 9:
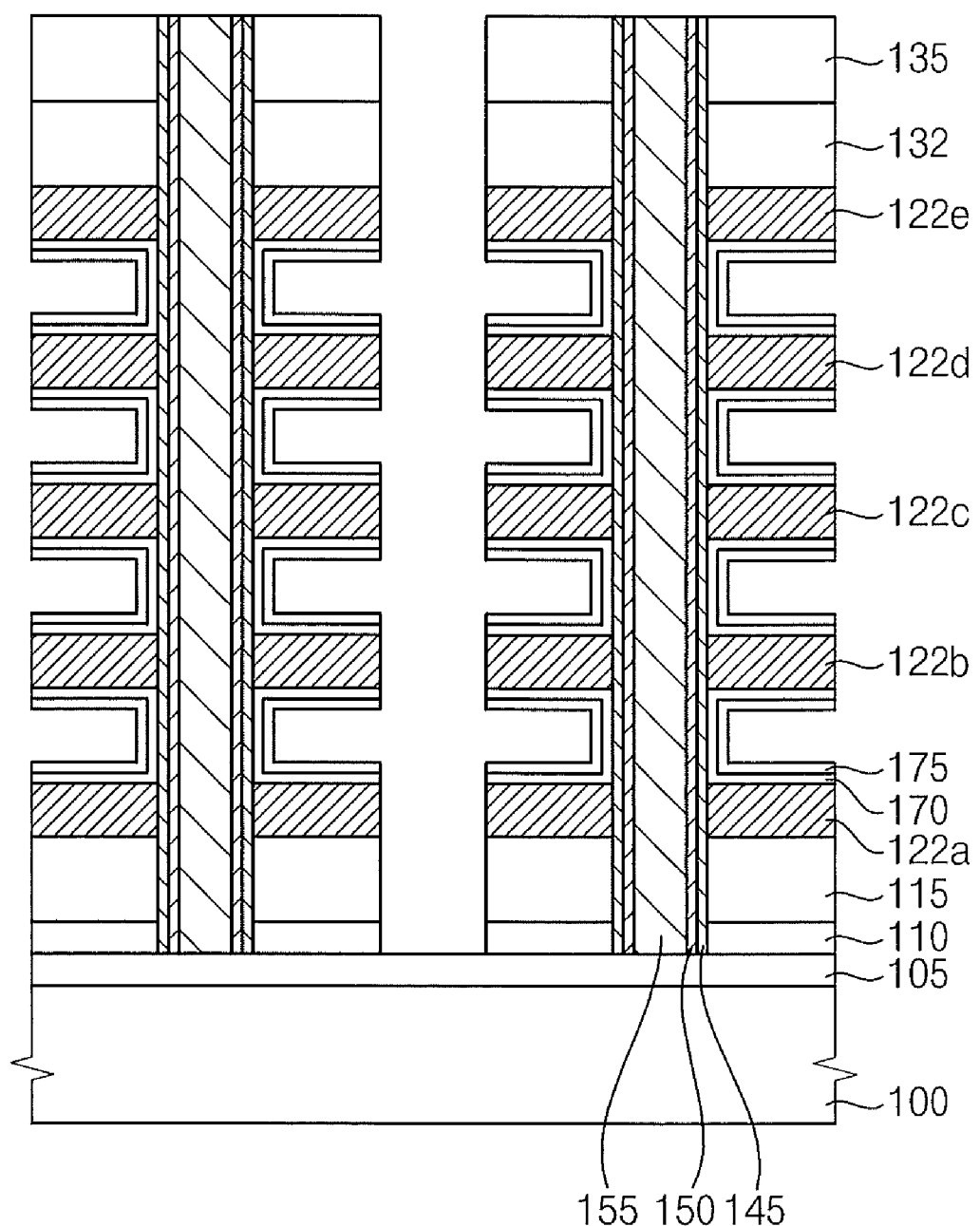

Referring to FIGS. 8 and 9, a second sacrificial layer 180 is formed on the blocking dielectric layer 175 to completely fill the opening 165 and the hole 160. Then, an anisotropic etch process is performed to partially remove the second sacrificial layer 180 and the blocking dielectric layer 175 and the charge-trapping layer 170 on the sidewalls of the insulation interlayers in different layers. Accordingly, the charge-trapping layer 170 and the blocking dielectric layer 175 in different layers are separated from one another. Next, the remaining second sacrificial layer 180 is completely removed as illustrated in FIG. 10.

Figure 10:
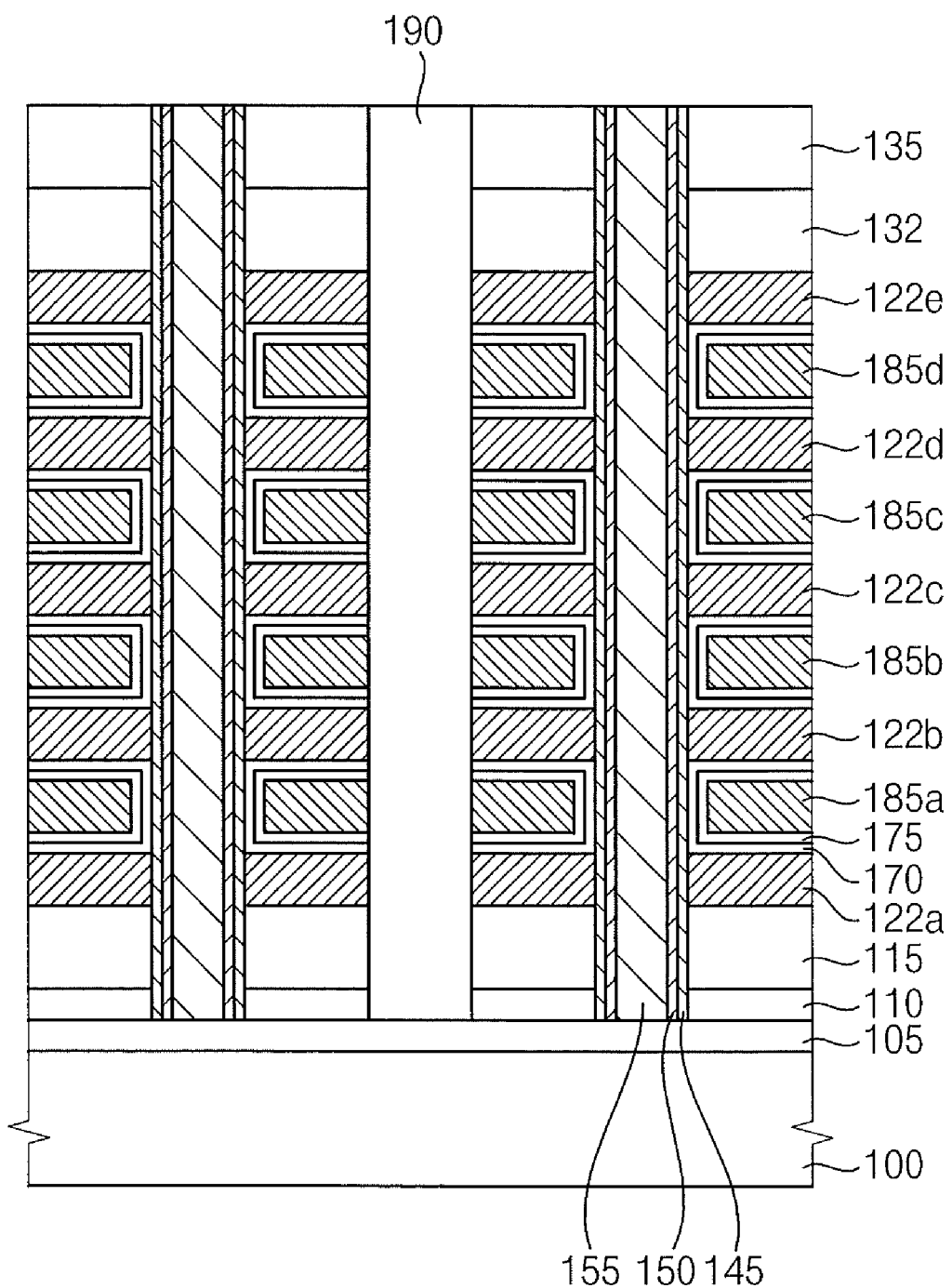

Referring to FIG. 10, first to nth control gate patterns are formed on the blocking dielectric layer 175 between the first to n+1th insulation interlayer patterns. In this embodiment, the first to fourth control gate patterns 185a, 185b, 185c and 185d may be formed between the insulation interlayer patterns 122a, 122b, 122c, 122d and 122e.

In particular, a conductive layer (not illustrated) is deposited on the blocking dielectric layer 175 to fill the openings. For example, the conductive layer may be formed using polysilicon doped with impurities. The conductive layer is planarized until an upper surface of the upper insulation layer 135 is exposed, to form a conductive layer pattern (not illustrated).

A photoresist pattern (not illustrated) is formed on the conductive layer pattern to selectively expose a portion of the conductive layer pattern formed in the opening. The photoresist pattern may have an exposing portion the same size as, or larger than, the first opening 118.

The exposed conductive layer pattern is anisotropically etched using the photoresist pattern as an etching mask to form the control gate patterns 185a, 185b, 185c and 185d between each of the layers of the insulation interlayer patterns.

Next, an isolation insulation layer pattern 190 is formed to fill between the control gate patterns 185a, 185b, 185c and 185d.

The control gate pattern in each of the layers may have a linear shape extending in the first direction. The isolation insulation layer pattern 190 between the single-crystalline semiconductor patterns 150 is formed between the control gate patterns 185a, 185b, 185c and 185d of the same layer. The isolation insulation layer pattern 190 may penetrate the control gate patterns and the insulation layer patterns to be connected to the upper surface of the impurity region 105.

Accordingly, the control gate patterns 185a, 185b, 185c and 185d in the same layer arranged in the first direction may have a linear shape, and thus, the control gate pattern may be provided as a word line. On the other hand, the control gate patterns 185a, 185b, 185c and 185d of different layers may be insulated from one another by the insulation interlayer patterns.

Figure 11:
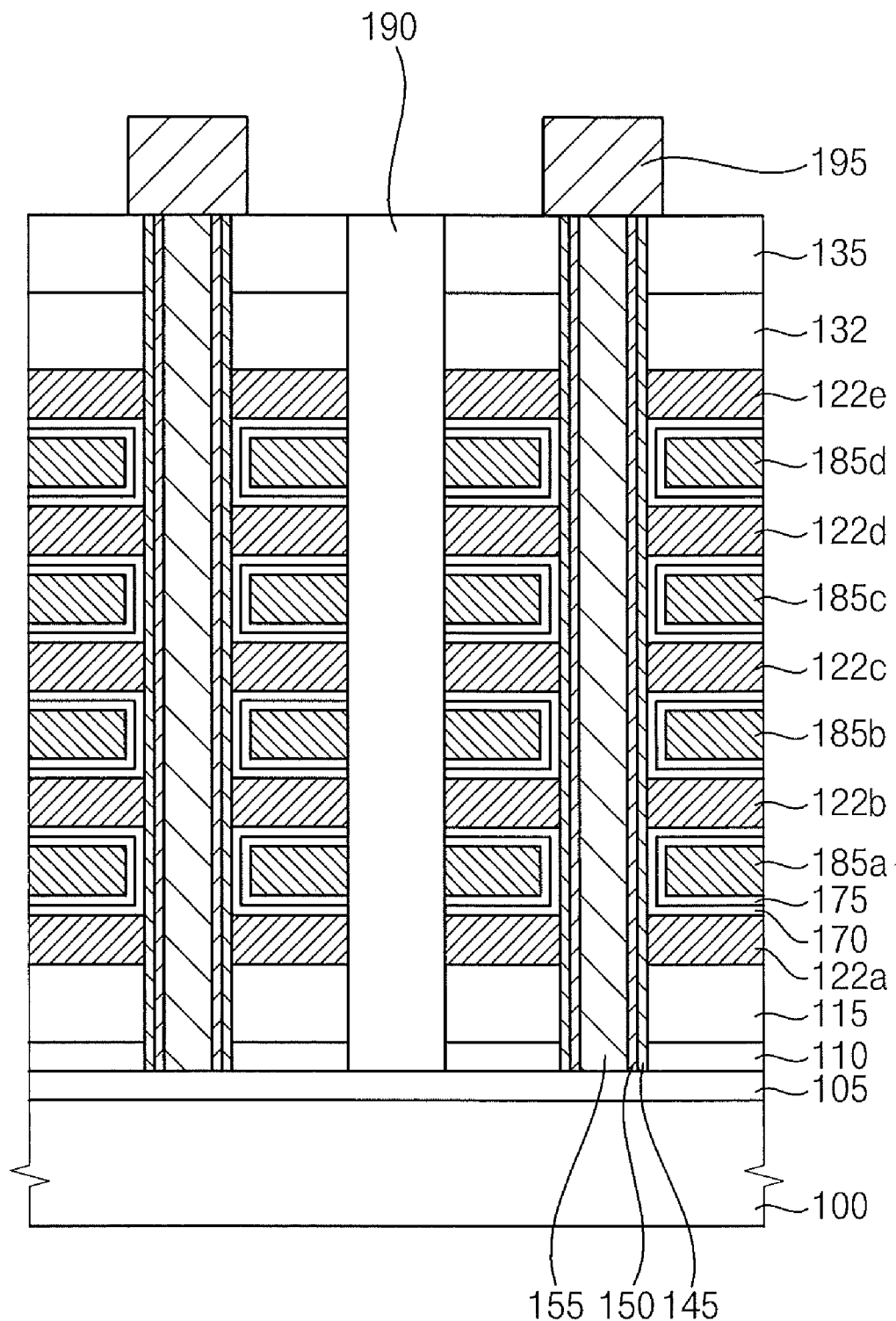

Referring to FIG. 11, a bit line 195 is formed on the exposed single-crystalline semiconductor patterns 150 to connect the single-crystalline semiconductor patterns 150 that are spaced apart from one another and arranged repeatedly in the first direction.

The impurity region 105 provided as a common source line under the surface of the substrate 100 is connected to the single-crystalline semiconductor patterns 150, such that lower portions of the strings are connected to one another.

As mentioned above, the tunnel oxide layer 145 is directly on the upper electrode layer pattern 132 that is used as a gate of a string select line. The tunnel oxide layer 145 is directly on the lower electrode layer pattern 115 that is used as a gate of a ground source line. Accordingly, a vertical-type flash memory device in accordance with an example embodiment includes a cell string of a ground source transistor, a string select transistor and cell transistors formed on the pillar shaped single-crystalline semiconductor pattern, wherein the ground source transistor and the string select transistor have no charge-trapping layer between the upper and lower electrode layer patterns and the tunnel oxide layer. Therefore, the voltage drop occurring during operation of the ground source transistor and the string select transistor may be reduced to thereby increase reliability of the memory device. In addition, the number of the single-crystalline semiconductor patterns to be formed in a volume with a narrow lateral dimension may be increased, and thus the degree of integration of the memory device may be enhanced. Further, since the cell transistors may be formed in the single-crystalline semiconductor pattern with fewer crystal defects, a cell current and cell distribution characteristics of the cell transistor may be excellent.

Therefore, since there is no charge-trapping layer on the GSL gate and the SSL gate, the voltage drop may be reduced to decrease the operation voltage thereof.

FIGS. 12 to 21 are cross-sectional views illustrating a method of manufacturing a vertical-type non-volatile memory device in accordance with an example embodiment.

Figure 12:
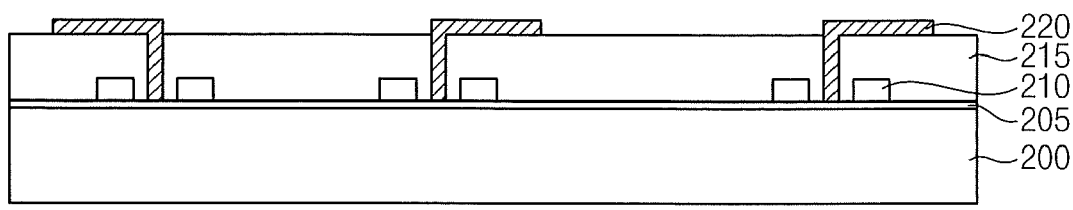
FIGS. 12 to 21 are cross-sectional views illustrating a method of manufacturing a vertical-type non-volatile memory device in accordance with an example embodiment.

Referring to FIG. 12, a substrate 200 including single-crystalline silicon is prepared. An isolation process is performed on the substrate 200 to form an isolation region and an active region.

After a gate oxide layer 205 and a gate electrode 210 are formed on the substrate 200, impurities are doped into the substrate on both sides of the gate electrode 210 to form source/drain regions (not illustrated). Then, NMOS transistors and PMOS transistors 210 for core and peripheral circuits are formed in the substrate.

A first lower insulation interlayer 215 is formed to cover the NMOS transistor and the PMOS transistor. The first lower insulation interlayer 215 may be formed using silicon oxide by a chemical vapor deposition process.

A contact hole is formed in the first lower insulation interlayer 215 by a photolithography process, and then, a first conductive layer is deposited to fill the contact hole and is planarized to form a first conductive layer pattern.

A second conductive layer is formed on the first conductive layer and patterned to form a first lower conductive line 220. The first conductive line 220 may include metal or polysilicon doped with impurities. For example, the first conductive line 220 may be formed using a metal material having a low resistance.

Figure 13:
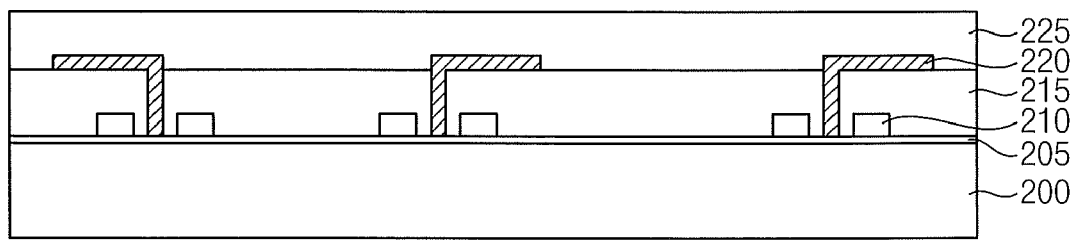

Referring to FIG. 13, a second lower insulation interlayer 225 is formed on the first lower insulation interlayer 215 where the first conductive line 220 is formed.

Figure 14:
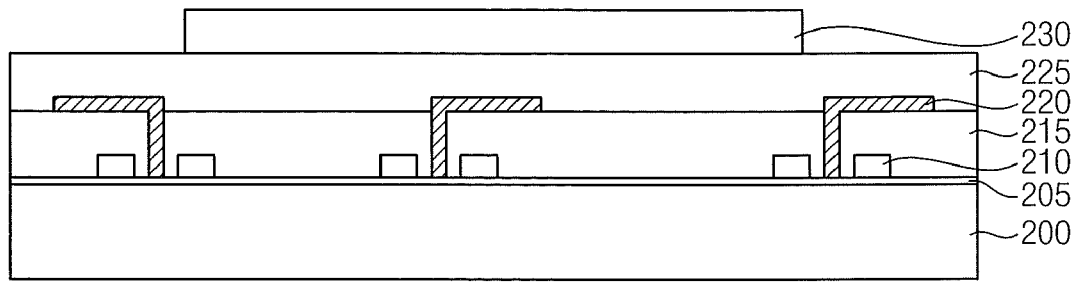

Referring to FIG. 14, a single-crystalline silicon layer 230 is formed on the second lower insulation interlayer 215. The single-crystalline silicon layer 230 may be formed by a substrate bonding process.

In particular, a donor single-crystalline silicon substrate to be bonded on the second lower insulation interlayer 225 is prepared. Hydrogen ions are doped into the donor single-crystalline silicon substrate form an ion doped region therein. Then, the donor substrate is laid on the accept substrate including the second lower insulation interlayer 225 and then, thermal treated to be bonded on the second insulation interlayer of the accept substrate. Then, the ion doped region is separated from the donor substrate to form a preliminary single-crystalline silicon layer. The preliminary single-crystalline silicon layer is planarized by a chemical mechanical polishing process to form the single-crystalline silicon layer 230.

Then, the single-crystalline silicon layer 230 is patterned by a photolithography process such that the single-crystalline silicon layer 230 remains on the active region. Accordingly, the single-crystalline silicon layer 230 is formed only on the region where a cell block is formed.

Next, the same or like processes as those explained with reference to FIGS. 3 to 12 may be performed to form cell structures.

Figure 15:
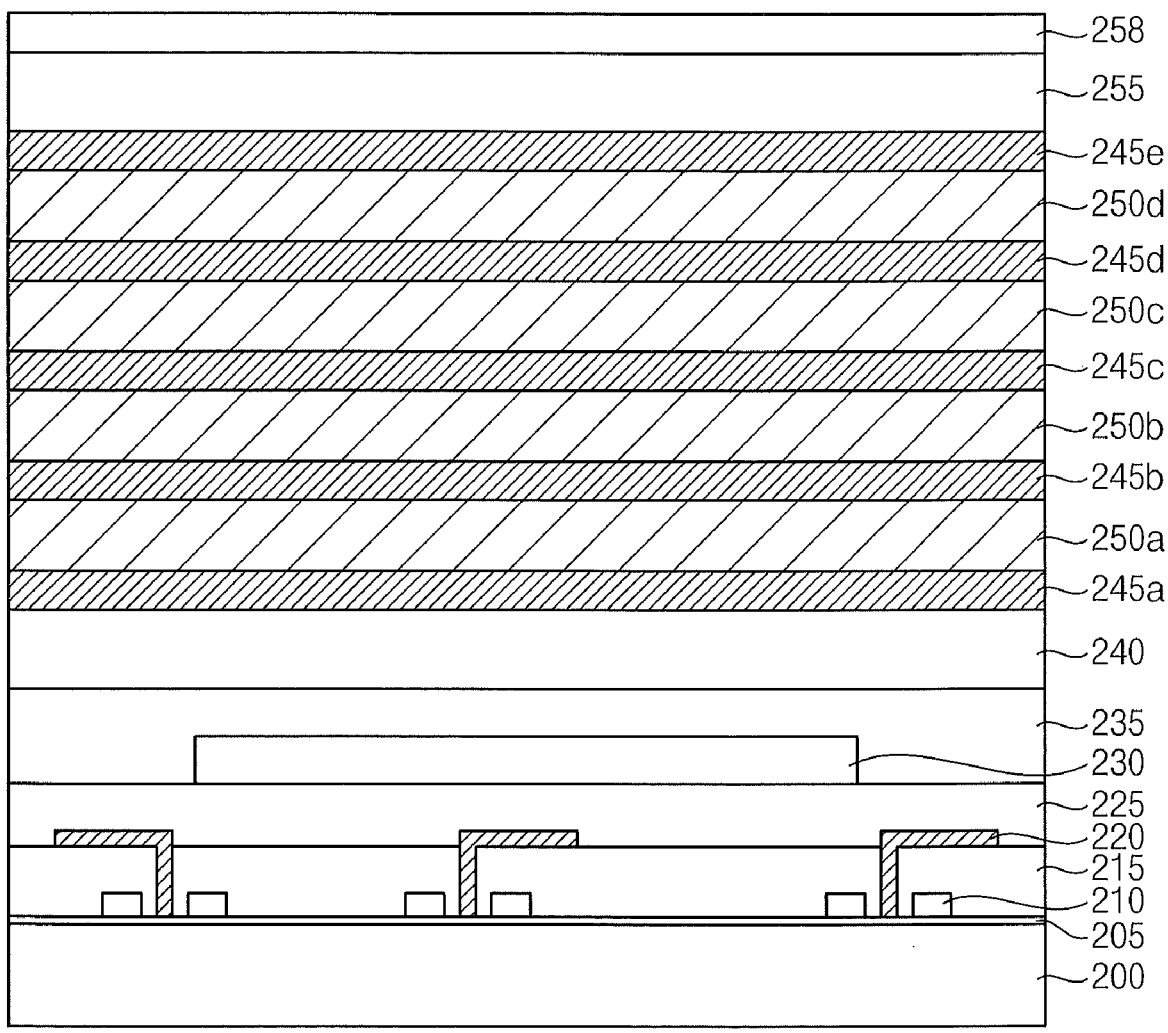

Referring to FIG. 15, impurities are partially doped into the single-crystalline silicon layer 230 to form an impurity region. A third lower insulation layer 235 is formed on the single-crystalline silicon layer 230. The third insulation layer 235 may be formed by a chemical vapor deposition process. The third insulation layer 235 may be formed to have a thickness of about 500 Angstroms to about 1500 Angstroms.

A lower electrode layer 240 for a ground source line is formed on the third insulation layer 235. For example, the lower electrode layer 240 may be formed using polysilicon doped with impurities or metal.

Electrode insulation interlayers and sacrificial layers are repeatedly formed on the lower electrode layer 240.

An electrode insulation interlayer 245a is formed on the lower electrode layer 240. The electrode insulation interlayer 245a may be formed by a chemical vapor deposition process. For example, the electrode insulation interlayer 245a may be formed using silicon oxide. The electrode insulation interlayer 245a may be formed to have a thickness of about 500 Angstroms to about 1000 Angstroms.

A first sacrificial layer 250a is formed on the electrode insulation interlayer 245a. For example, the first sacrificial layer 250a may be formed using silicon nitride. The first sacrificial layer 250a may be formed to have about 500 Angstroms to about 1000 Angstroms. The thickness of the sacrificial layer may be greater than that of a control gate layer to be formed by a following process.

Another electrode insulation interlayer 245b is formed on the first sacrificial layer 250a using the same process as the electrode insulation interlayer 245a. Another first sacrificial layer 250b is formed on another insulation interlayer 245b using the same process as the first sacrificial layer 250a. Similarly, the first to n+1th electrode insulation interlayer patterns (n is a natural number greater than 1) may be formed repeatedly on the lower electrode layer 240. In this embodiment, the first to 5th electrode insulation interlayers 245a, 245b, 245c, 245d and 245e and the first sacrificial layers 250a, 250b, 250c and 250d may be alternately stacked with one another.

An upper electrode layer 255 for a string select line is formed on the uppermost electrode insulation interlayer 250e. For example, the upper electrode layer 255 may be formed using polysilicon doped with impurities or metal.

An upper insulation layer 258 is formed on the upper electrode layer 255. The upper insulation layer may be formed using silicon oxide by a chemical vapor deposition process or a physical vapor deposition process.

Figure 16:
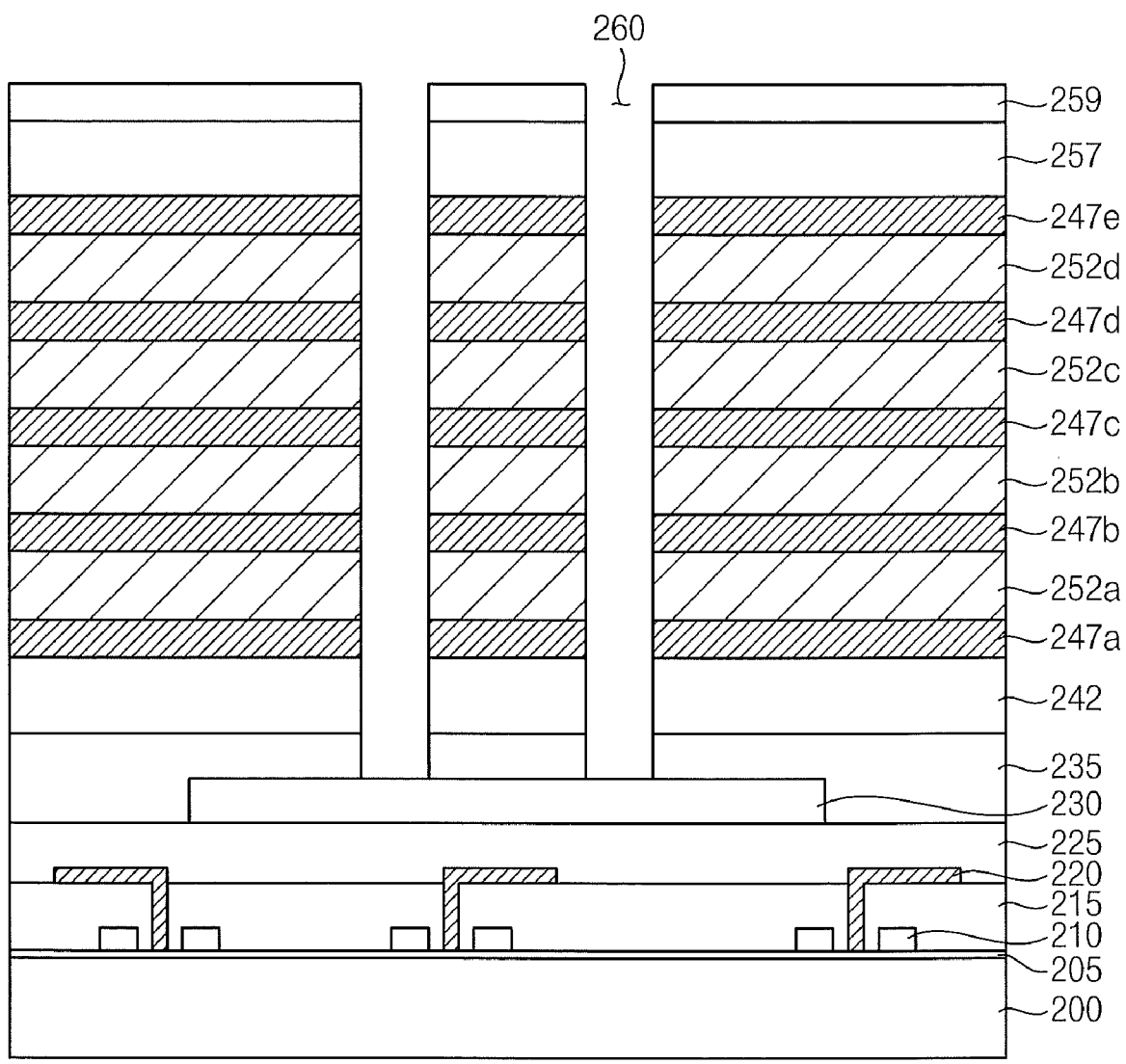

Referring to FIG. 16, a photolithography process is performed on the repeatedly stacked layers to form a channel hole 260. The channel hole 260 may be formed to expose the impurity region of the single-crystalline silicon layer 230.

Figure 17:
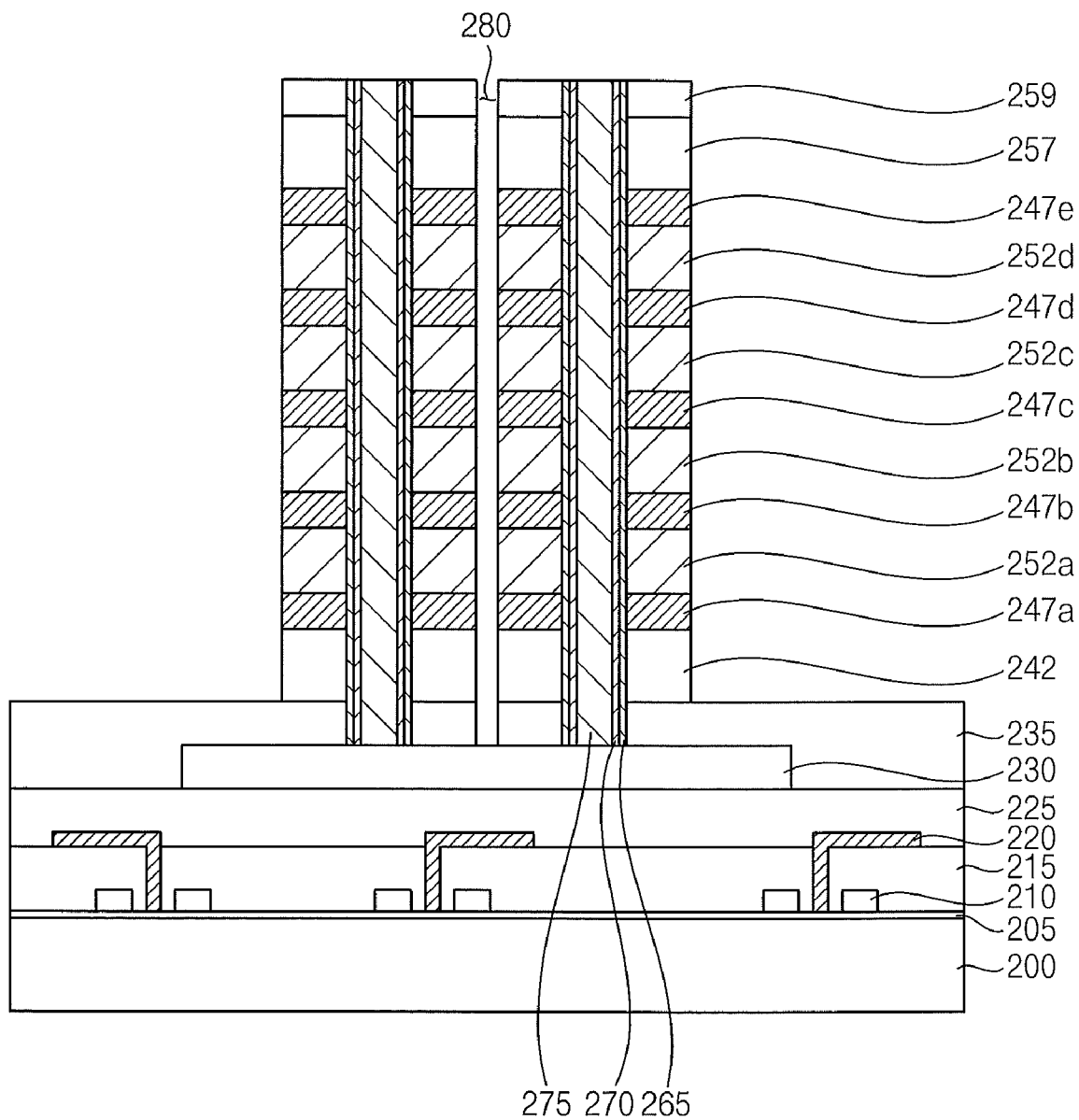

Referring to FIG. 17, a tunnel oxide layer 265 is formed on a sidewall of the channel hole 260. A single-crystalline semiconductor pattern 270 is formed on the tunnel oxide layer 265. The tunnel oxide layer 265 may be formed using silicon oxide. The tunnel oxide layer 265 may be formed to have a thickness of about 30☐-100☐. A polysilicon layer may be formed on the tunnel oxide layer 265 by a chemical vapor deposition process or an atomic layer deposition process, and then, the polysilicon layer may undergo phase transition from amorphous silicon by a laser thermal treatment, to form the single-crystalline semiconductor pattern 265.

After the tunnel oxide layer 265 and the single-crystalline semiconductor pattern 270 are formed on both sidewalls of the channel hole 260, an oxide layer 275 is formed to fill a void between the single-crystalline semiconductor patterns 270 facing each other. Accordingly, the pillar shaped single-crystalline semiconductor patterns 270 are formed respectively on both sidewalls of the oxide layer 275, and the tunnel oxide layer 265 is formed on the single-crystalline semiconductor pattern 270.

Then, a photolithography process is performed to form a hole 280 for removing first sacrificial layer patterns 252a, 252b, 252c and 252d in the middle of the first sacrificial layer patterns. The impurity region of the single-crystalline silicon layer 230 may be exposed through the hole 280.

Figure 18:
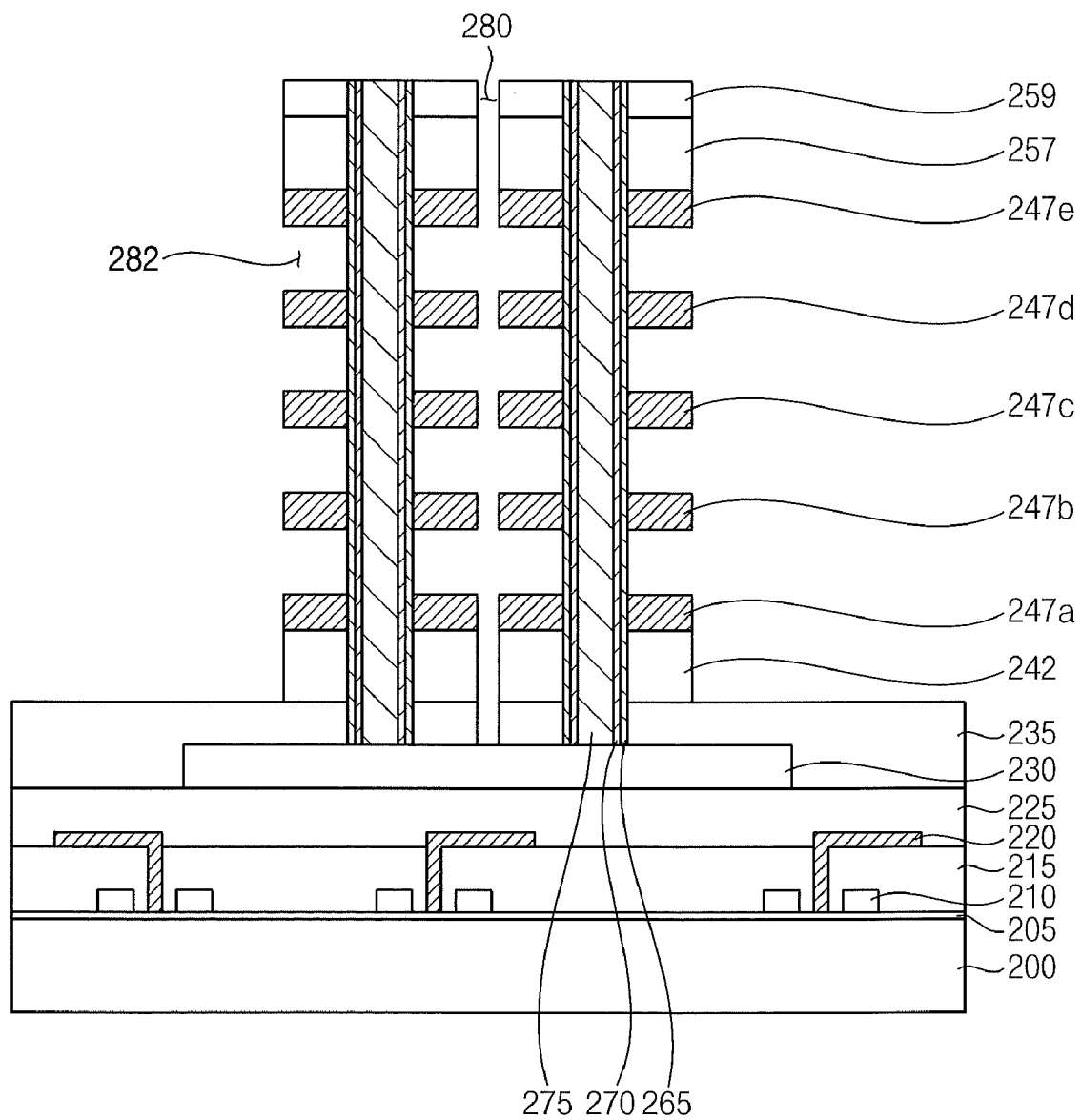

Referring to FIG. 18, an etch solution is applied through the hole 280 to remove the first sacrificial layer patterns 252a, 252b, 252c and 252d. Because the first sacrificial layer patterns include nitride, the first sacrificial layer patterns 252a, 252b, 252c and 252d may be removed using the etch solution including phosphoric acid.

Accordingly, the first sacrificial layer patterns 127a, 127b, 127c and 127d are removed to provide a space for forming a charge-trapping layer, a blocking dielectric layer and a control gate pattern. At this time, a peripheral circuit space may be formed together. The peripheral circuit space is filled with a conductive material by a following process to form a metal wiring structure.

Figure 19:
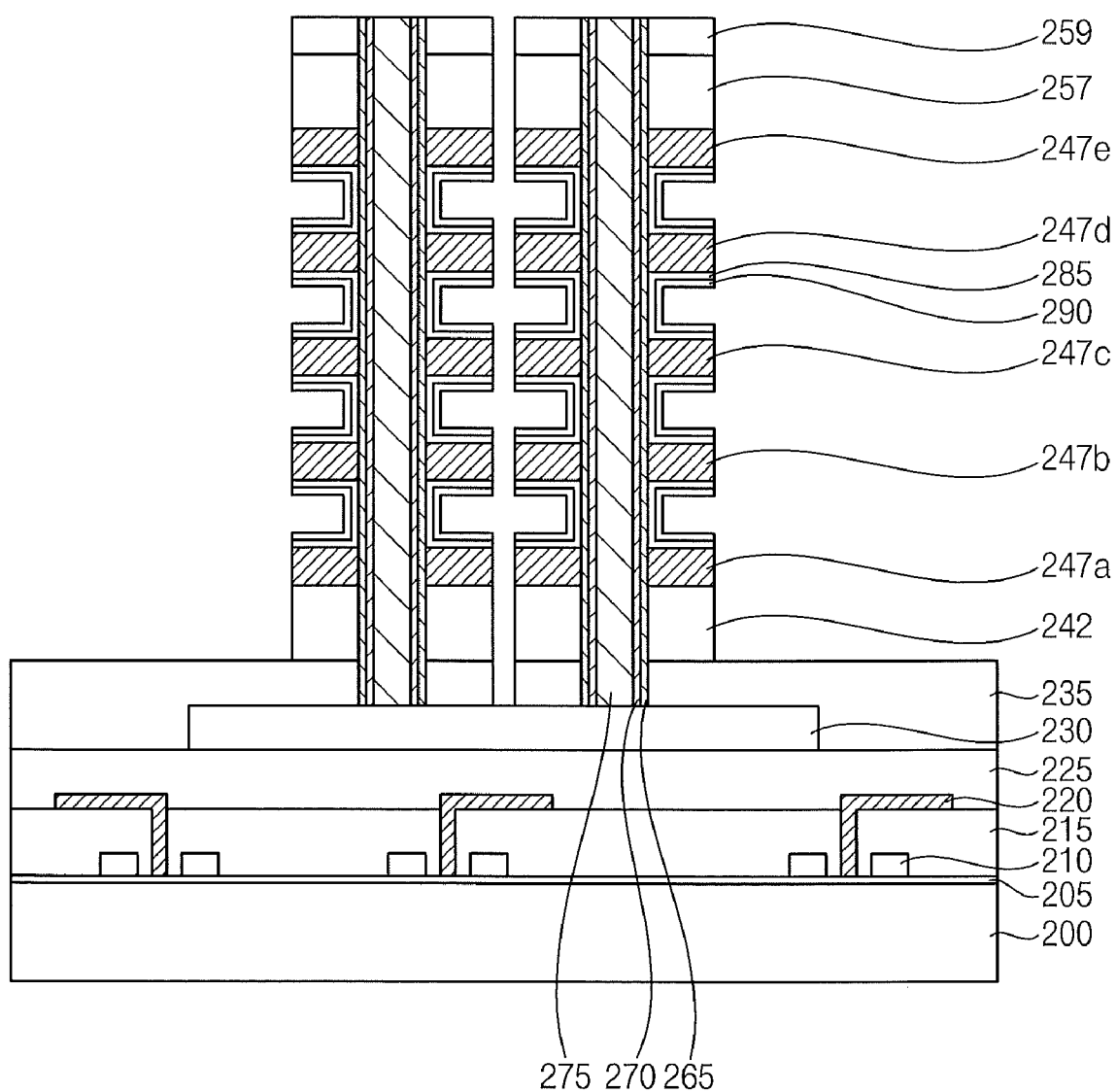

Referring to FIG. 19, a charge-trapping layer 285 is formed on first to $5^{th}$ electrode insulation interlayer patterns 247a, 247b, 247c, 247d and 247e. The charge-trapping layer 285 may be formed using an insulation material capable of trapping electric charge. For example, the charge-trapping layer 285 may be formed using silicon nitride or metal oxide. In this embodiment, silicon nitride may be deposited to form the charge-trapping layer having a relatively small thickness.

A blocking dielectric layer 290 is formed on the charge-trapping layer 285. The blocking dielectric layer 290 may be formed using silicon oxide or metal oxide. The metal oxide may be a material having a dielectric constant higher than silicon nitride. In here, the charge-trapping layer 285 and the blocking dielectric layer 290 may be conformally formed to follow the profile of the electrode insulation interlayer patterns without completely filling opening 282.

Then, a second sacrificial layer (not illustrated) is formed on the blocking dielectric layer 290 to completely fill the opening 282 and the hole 280. Next, an anisotropic etch process is performed to partially remove the second sacrificial layer and the blocking dielectric layer 290 and the charge-trapping layer 285 on the sidewalls of the electrode insulation interlayers in different layers. Accordingly, the charge-trapping layer 285 and the blocking dielectric layer 290 in different layers are separated from one another. Next, the remaining second sacrificial layer is completely removed from the electrode insulation interlayer patterns.

Figure 20:
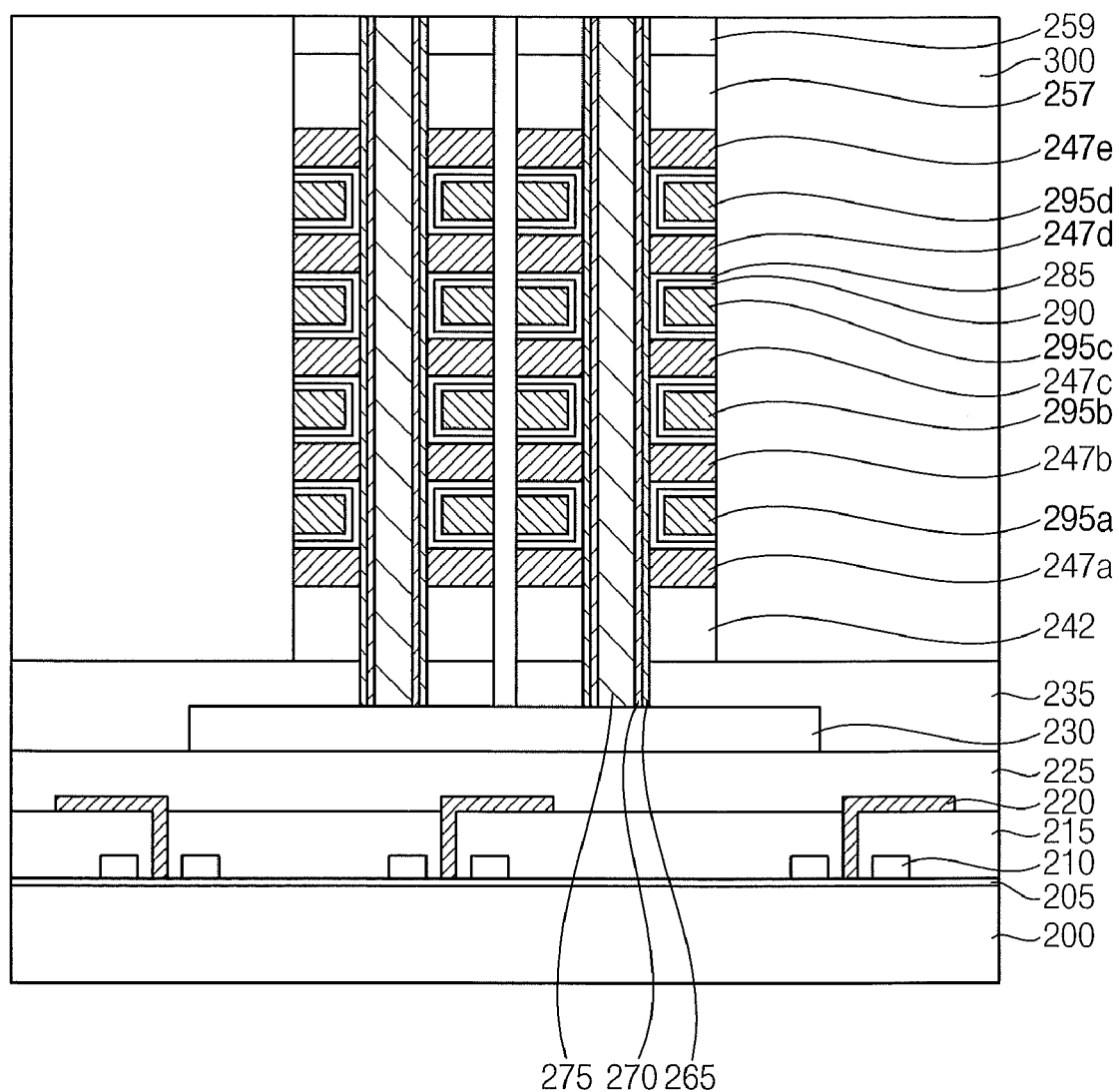

Referring to FIG. 20, first to nth control gate patterns are formed on the blocking dielectric layer 290 between the first to n+1th electrode insulation interlayer patterns. In this embodiment, the first to fourth control gate patterns 295a, 295b, 295c and 295d may be formed between the insulation interlayer patterns 247a, 247b, 247c, 247d and 247e.

In particular, a conductive layer (not illustrated) is deposited on the blocking dielectric layer 290 to fill the openings. For example, the conductive layer may be formed using polysilicon doped with impurities. The conductive layer is planarized until an upper surface of the upper insulation layer pattern 259 is exposed, to form a conductive layer pattern (not illustrated).

A photoresist pattern (not illustrated) is formed on the conductive layer pattern to selectively expose a portion of the conductive layer pattern formed in the opening. The photoresist pattern may have an exposing portion the same size as, or larger than, the first opening 280.

The exposed conductive layer pattern is anisotropically etched using the photoresist pattern as an etching mask to form the control gate patterns 295a, 295b, 295c and 295d between each of the layers of the insulation interlayer patterns.

Next, an isolation insulation layer pattern 300 is formed to fill between the control gate patterns 295a, 295b, 295c and 295d.

The control gate pattern in each of the layers may have a linear shape extending in the first direction. The isolation insulation layer pattern 300 between the single-crystalline semiconductor patterns 270 is formed between the control gate patterns 295a, 295b, 295c and 295d of the same layer. The isolation insulation layer pattern 300 may penetrate the control gate patterns and the insulation layer patterns to be connected to the upper surface of the impurity region of the single-crystalline silicon layer 230.

Accordingly, the control gate patterns 295a, 295b, 295c and 295d in the same layer arranged in the first direction may have a linear shape, and thus, the control gate pattern may be provided as a word line. On the other hand, the control gate patterns 295a, 295b, 295c and 295d of different layers may be insulated from one another by the insulation interlayer patterns.

Figure 21:
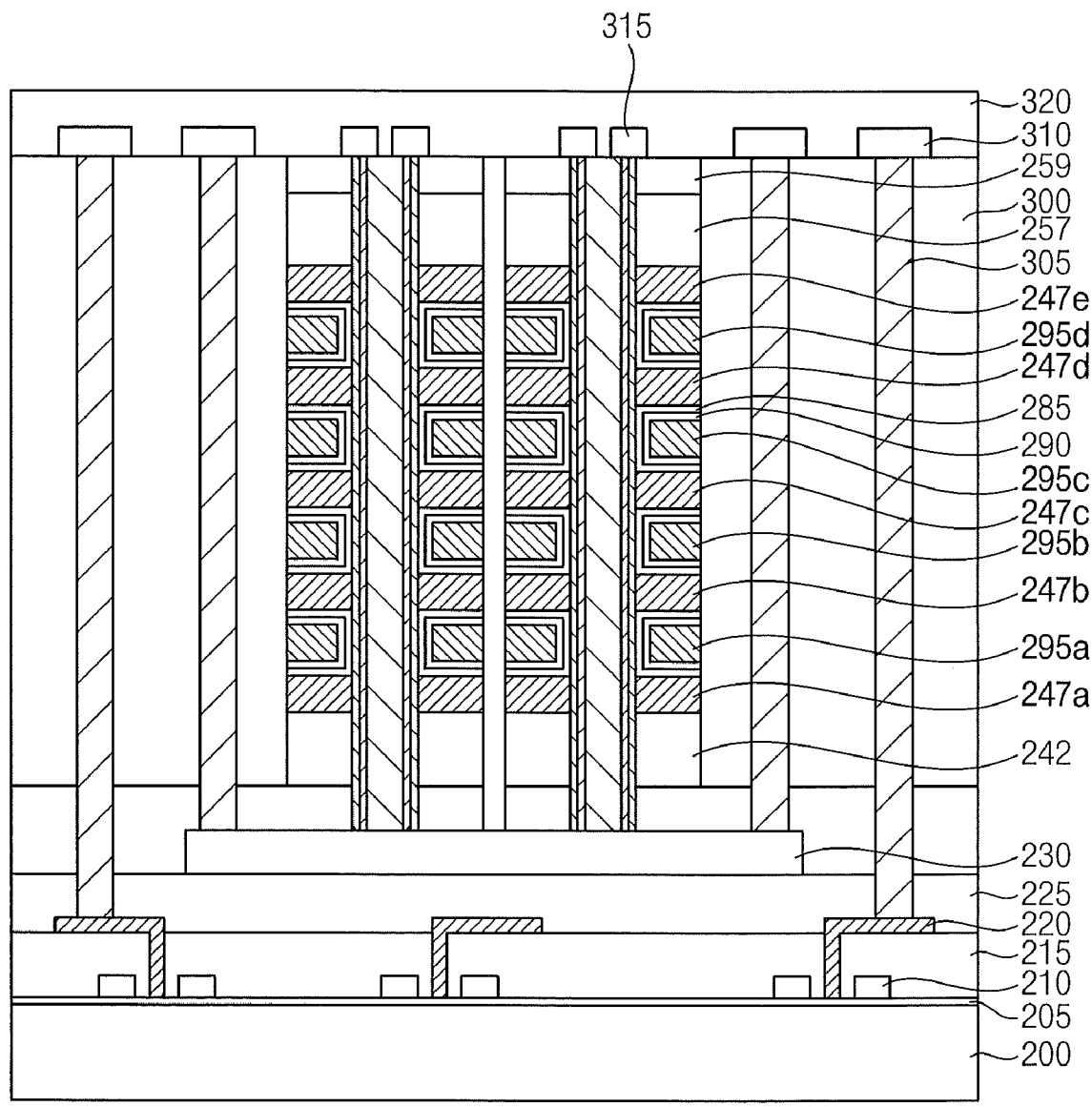

Referring to FIG. 21, a bit line 315 is formed on the exposed single-crystalline semiconductor patterns 270 to connect the single-crystalline semiconductor patterns 270 that are spaced apart from one another and arranged repeatedly in the first direction.

As mentioned above, the tunnel oxide layer 265 is directly on the upper electrode layer pattern 257 that is used as a gate of a string select line. The tunnel oxide layer 265 is directly on the lower electrode layer pattern 242 that is used as a gate of a ground source line. Accordingly, a vertical-type flash memory device in accordance with an example embodiment includes a cell string of a ground source transistor, a string select transistor and cell transistors formed on the pillar shaped single-crystalline semiconductor pattern, wherein the ground source transistor and the string select transistor have no charge-trapping layer between the upper and lower electrode layer patterns and the tunnel oxide layer. Therefore, the voltage drop occurring during operation of the ground source transistor and the string select transistor may be reduced to thereby increase reliability of the memory device. In addition, the number of the single-crystalline semiconductor patterns to be formed in a volume with a narrow lateral dimension may be increased, and thus the degree of integration of the memory device may be enhanced.

Figure 22:
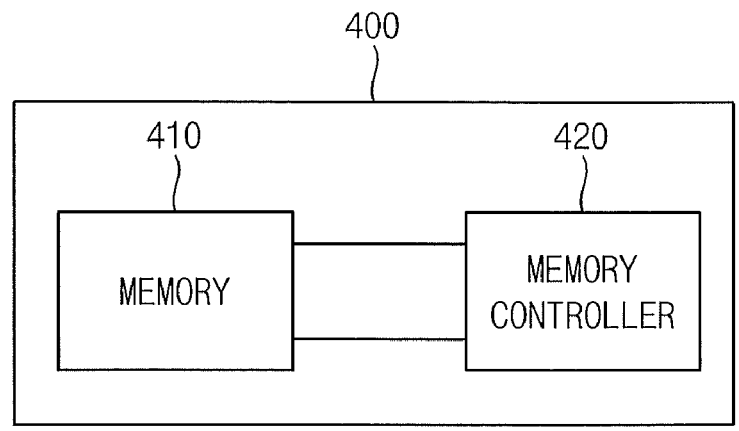
FIG. 22 is a block diagram illustrating a system including a memory device in accordance with an example embodiment.

FIG. 22 is a block diagram illustrating a system including a memory device in accordance with an example embodiment.

Referring to FIG. 22, a system 400 includes a memory 410 connected to a memory controller 420. The memory 410 may be the vertical-type non-volatile memory device wherein the ground source transistor and the string select transistor have no charge-trapping layer between the electrode layer pattern and the tunnel oxide layer, as discussed above. However, the memory 410 may be any vertical-type non-volatile memory device having the structures according to embodiments of the present inventive concept.

The memory controller 420 supplies the input signals for controlling operation of the memory 410. For example, the memory controller 420 supplies the command CMD and address ADD signals, I/O signals, etc. It will be appreciated that the memory controller 420 may control the vertical-type non-volatile memory device based on received signals.

Figure 23:
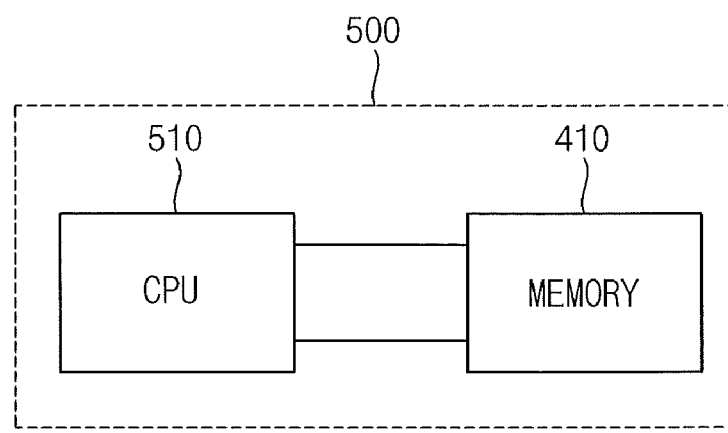
FIG. 23 is a block diagram illustrating another system including a memory device in accordance with an example embodiment.

FIG. 23 is a block diagram illustrating another system including a memory device in accordance with an example embodiment.

Referring to FIG. 23, a memory 410 may be connected with a central processing unit CPU 510. The memory 410 may be the vertical-type non-volatile memory device wherein the ground source transistor and the string select transistor have no charge-trapping layer between the electrode layer pattern and the tunnel oxide layer, as discussed above. However, the memory 410 may be any vertical-type non-volatile memory device having the structures according to embodiments of the present inventive concept. The CPU 510 receives data from the memory and supplies operation signals.

Figure 24:
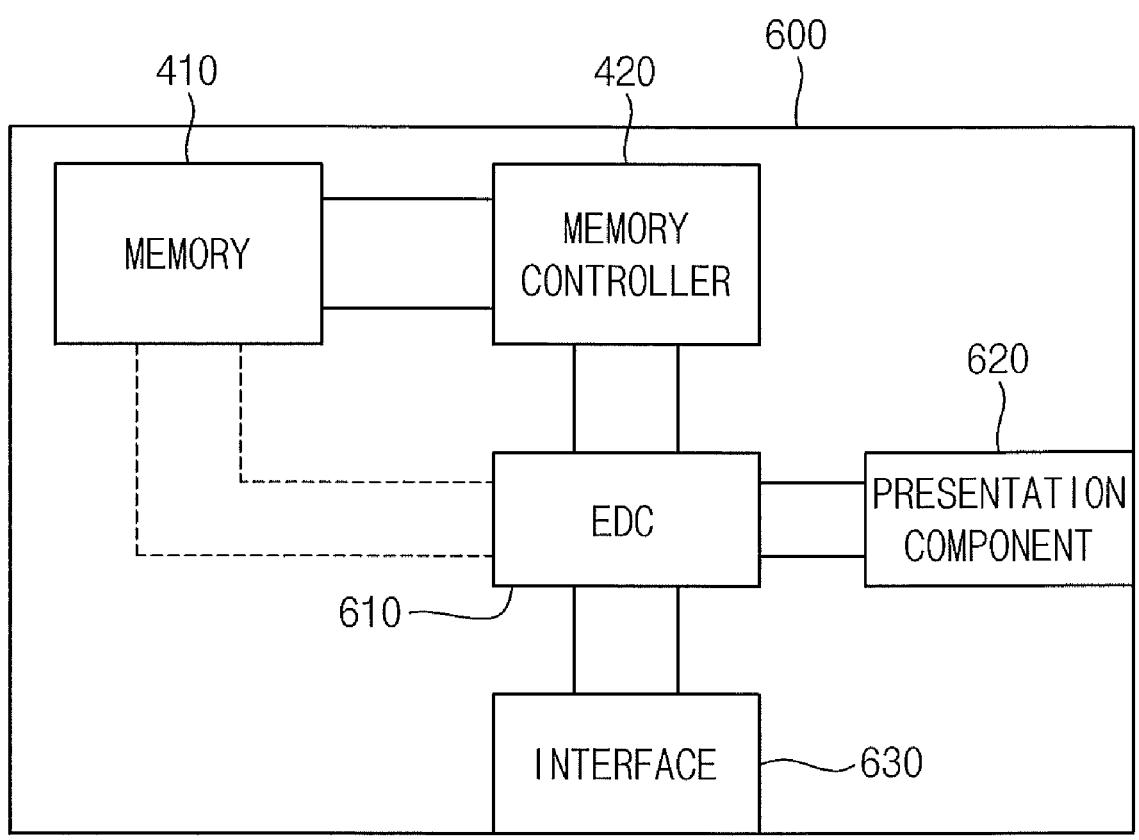
FIG. 24 is a block diagram illustrating a still another system including a memory device in accordance with an example embodiment.

FIG. 24 is a block diagram illustrating a still another system including a memory device in accordance with an example embodiment.

Referring to FIG. 24, this embodiment represents a portable device 600. The portable device 600 may be an MP3 player, video player, combination video and audio player, etc. As illustrated, the portable device 600 includes the memory 410 and memory controller 420. The memory 510 may be any vertical-type non-volatile memory device having the structures according to embodiments of the present inventive concept. The portable device 600 may also includes an encoder/decoder EDC 610, a presentation component 620 and an interface 630. Data (video, audio, etc.) is input to and output from the memory 410 via the memory controller 420 by the EDC 610.

As mentioned above, a vertical-type flash memory device in accordance with an example embodiment includes a cell string of a ground source transistor, a string select transistor and cell transistors formed on a pillar shaped single-crystalline semiconductor pattern, wherein the ground source transistor and the string select transistor have no charge-trapping layer between upper and lower electrode layer patterns and a tunnel oxide layer. Therefore, the voltage drop occurring during operation of the ground source transistor and the string select transistor may be reduced to thereby increase reliability of the memory device. In addition, the number of the single-crystalline semiconductor patterns to be formed in a volume with a narrow lateral dimension may be increased, and thus the degree of integration of the memory device may be enhanced. Further, since the cell transistors may be formed in the single-crystalline semiconductor pattern with fewer crystal defects, a cell current and cell distribution characteristics of the cell transistor may be excellent.

Therefore, since there is no charge-trapping layer on the GSL gate and the SSL gate, the voltage drop may be reduced to decrease the operation voltage thereof.

The foregoing is illustrative of example embodiments and is to not be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is to not be construed as limited to the specific example embodiments disclosed, and that modifications to the disclosed example embodiments, as well as other example embodiments, are intended to be included within the scope of the appended claims.

What is claimed is:

1. A vertical-type non-volatile memory device, comprising:
 an insulation layer pattern on a substrate, the insulation layer pattern having a linear shape;
 single-crystalline semiconductor patterns on the substrate directly on a sidewall of the insulation layer pattern, the single-crystalline semiconductor patterns comprising a pillar shape extending in a vertical direction that is oriented perpendicular relative to a major surface of the substrate;
a tunnel oxide layer on the single-crystalline semiconductor pattern;
a lower electrode layer pattern directly on the tunnel oxide layer and on the substrate;
a plurality of insulation interlayer patterns on the lower electrode layer pattern, the insulation interlayer patterns being spaced apart from one another by a distance along the single-crystalline semiconductor pattern;
a charge-trapping layer and a blocking dielectric layer on the tunnel oxide layer between the insulation interlayer patterns;
a plurality of control gate patterns on the blocking dielectric layer between the insulation interlayer patterns; and
an upper electrode layer pattern on the tunnel oxide layer and on an uppermost portion of the insulation interlayer pattern.

2. The vertical-type non-volatile memory device of claim 1, wherein the charge-trapping layer comprises silicon nitride or metal oxide.

3. The vertical-type non-volatile memory device of claim 1, wherein the charge-trapping layer and the blocking dielectric layer comprise respective conformal layers following a surface of the tunnel oxide layer, and upper and bottom surfaces of the insulation interlayer patterns.

4. The vertical-type non-volatile memory device of claim 1, further comprising a lower insulation layer between the lower electrode layer pattern and the substrate.

5. The vertical-type non-volatile memory device of claim 1, wherein the single-crystalline semiconductor pattern comprises single-crystalline silicon.

6. The vertical-type non-volatile memory device of claim 5, wherein the single-crystalline semiconductor pattern is formed by thermally treating amorphous silicon to undergo phase transition to single-crystalline silicon.

7. The vertical-type non-volatile memory device of claim 1, wherein the blocking dielectric layer comprises silicon oxide or metal oxide.

8. The vertical-type non-volatile memory device of claim 1, further comprising an impurity region in the substrate, the impurity region being electrically connected to the single-crystalline semiconductor pattern.

9. A vertical-type non-volatile memory device, comprising:
single-crystalline semiconductor pattern comprising a material for formation of a vertical channel of the device, wherein the vertical channel is oriented perpendicular to a major surface of a substrate for the device;
a tunnel oxide layer on the single-crystalline semiconductor pattern;
a ground select transistor including a lower gate electrode layer pattern directly on the tunnel oxide layer; and
a string select transistor including an upper electrode layer pattern directly on the tunnel oxide layer.

10. A vertical-type non-volatile memory device, comprising:
single-crystalline semiconductor pattern comprising a material for formation of a vertical channel of the device, wherein the vertical channel is oriented perpendicular to a major surface of a substrate for the device;
a tunnel oxide layer on the single-crystalline semiconductor pattern;
a ground select transistor including a lower electrode layer pattern directly on the tunnel oxide layer; and
a string select transistor including an upper electrode layer pattern on the tunnel oxide layer.

11. The vertical-type non-volatile memory device of claim 10, wherein the single-crystalline semiconductor pattern extends in a vertical direction that is oriented perpendicular relative to the major surface of the substrate.

12. The vertical-type non-volatile memory device of claim 10, wherein the single-crystalline semiconductor pattern comprises single-crystalline silicon.

13. The vertical-type non-volatile memory device of claim 10, further comprising:
a charge-trapping layer and a blocking dielectric layer on the tunnel oxide layer; and
a control gate pattern on the blocking dielectric layer.

14. The vertical-type non-volatile memory device of claim 13, further comprising a plurality of insulation interlayer patterns on the lower electrode layer pattern, the insulation interlayer patterns being spaced apart from one another by a distance along the single-crystalline semiconductor pattern.

15. The vertical-type non-volatile memory device of claim 14, wherein the charge-trapping layer and the blocking dielectric layer are between the insulation interlayer patterns, and the control gate pattern is between the insulation interlayer patterns.

16. The vertical-type non-volatile memory device of claim 14, where the charge-trapping layer and the blocking dielectric layer comprise respective conformal layers following a surface of the tunnel oxide layer, and upper and bottom surfaces of the insulation interlayer patterns.

17. The vertical-type non-volatile memory device of claim 14, wherein the upper electrode layer pattern is on the uppermost insulation interlayer pattern.

18. The vertical-type non-volatile memory device of claim 13, wherein the charge-trapping layer comprises silicon nitride or metal oxide.

19. The vertical-type non-volatile memory device of claim 13, wherein the blocking dielectric layer comprises silicon oxide or metal oxide.

20. The vertical-type non-volatile memory device of claim 10, further comprising an impurity region in the substrate, the impurity region being electrically connected to the single-crystalline semiconductor pattern.

* * * * *